(12) United States Patent
Ohta et al.

(10) Patent No.: US 7,079,323 B2
(45) Date of Patent: Jul. 18, 2006

(54) SURFACE TREATMENT METHOD AND OPTICAL PART

(75) Inventors: Tatsuo Ohta, Otsuki (JP); Satoshi Nakano, Hachioji (JP); Hiroshi Hirayama, Musashino (JP)

(73) Assignee: Konica Corporation, Tokyo (JP)

( * ) Notice: Subject to any disclaimer, the term of this patent is extended or adjusted under 35 U.S.C. 154(b) by 161 days.

(21) Appl. No.: 10/456,836

(22) Filed: Jun. 9, 2003

(65) Prior Publication Data
US 2003/0228413 A1    Dec. 11, 2003

(30) Foreign Application Priority Data
Jun. 11, 2002   (JP) .............................. 2002-169793

(51) Int. Cl.
*G02B 25/00*   (2006.01)
*H05H 1/24*    (2006.01)

(52) U.S. Cl. ..................... 359/642; 427/164; 427/569
(58) Field of Classification Search ................ 359/642; 427/162, 164, 569–579
See application file for complete search history.

(56) References Cited

U.S. PATENT DOCUMENTS

| | | | |
|---|---|---|---|
| 6,577,358 B1 * | 6/2003 | Arakawa et al. ............. 349/57 |
| 2003/0020188 A1 * | 1/2003 | Bolle ........................ 264/1.7 |
| 2003/0058547 A1 * | 3/2003 | Hori et al. ................. 359/642 |

* cited by examiner

*Primary Examiner*—Huy Mai
(74) *Attorney, Agent, or Firm*—Finnegan, Henderson, Farabow, Garrett & Dunner, L.L.P.

(57) ABSTRACT

A surface treating method of forming a coating layer on a base material, comprising conducting a plasma processing under an atmospheric pressure for the base material so as to form a coating layer on the base material having at least one of a curved surface and an uneven surface.

22 Claims, 11 Drawing Sheets

SURFACE TREATMENT METHOD AND OPTICAL PART

BACKGROUND OF THE INVENTION

The present invention relates to a surface treatment method and an optical part, and particularly to a surface treatment method utilizing atmospheric pressure plasma and an optical part treated thereby.

For example, an optical part formed by injection molding of a resin material is mounted on a precision optical instrument such as an optical pick-up device so as to exhibit optical functions of high precision. In such an optical part, there are some provided with fine roughness such as a diffraction grating of a ring band form on the optical plane, to exhibit higher optical functions.

In case of forming such as an anti-reflection film on an optical part, heretofore, a thin film is formed on an optical plane by adhesive deposition of particles for film formation by means of such as a vacuum evaporation method and a sputtering method. However, in case of performing a deposition treatment on an optical part material of which an optical plane is provided with fine roughness, there are problems described below according to a vacuum evaporation method and a sputtering method.

FIG. 3 shows a partial cross section of a lens of which a sawtoothed ring band diffraction structure of an optical plane was subjected to deposition, and such as film thickness is shown exaggeratedly. As shown in the drawing, when there is sawtoothed roughness on the plane on which film is to be deposited, film thickness made of particles deposited thereon generates unevenness due to various reasons such as difference of an incidence angle of particles to the deposition plane and obstruction by the convex portions to particles to proceed toward the concave portions. When such unevenness of film thickness is generated, there may be caused discrepancies between a produced part form and a designed form resulting in that even an optical part having excellent optical characteristics in a designed stage possibly cannot exhibit satisfactory optical characteristics as a practical product. Further, inherent functions of a thin film (such as an anti-reflection function) possibly are not exhibited sufficiently.

For these manufacturing problems, heretofore, a device, in which by rotating an optical part on which film is to be deposited or a jig to hold the part so as to perform more uniform deposition on an optical plane, is provided, however, it has been difficult to form a sufficiently uniform film without deteriorating the capabilities. Further, in such a deposition treatment according to conventional techniques, there have been problems in that a device to rotate an optical part or a jig, and a space for rotation are required, and that a number of optical parts treated at one time becomes small resulting in poor treatment efficiency. Further, in case of vacuum evaporation, because apparatuses such as a closed vessel and an exhausting apparatus have to be set due to an optical part being necessarily placed in vacuum surrounding, there caused cost increase in addition to handling inconvenience.

SUMMARY OF THE INVENTION

The invention has been performed in view of such problems of conventional techniques, and an object of the invention is to provide a surface treatment method in which uniform deposition can be performed regardless of a surface shape to be treated and an optical part on which a film is deposited thereby, as well as to provide a surface treatment method in which a uniform film can be deposited even under atmospheric pressure and an optical part on which a film is deposited thereby.

A surface treatment method described in item 1 is a surface treatment method to form a coating film on a substrate having a curved surface; since a coating film is formed on the above-described curved surface by an atmospheric pressure plasma method, a film having very uniform thickness and characteristics can be formed even when the surface of a substrate on which a film is deposited (hereinafter, referred to as a deposition surface) has a small radius of curvature; in addition, since it is not necessary to rotate a substrate nor to place a substrate in a vacuum atmosphere, which are required with a conventional technique, the manufacturing cost is decreased due to a depressed facility cost, and as well as a treatment efficiency is improved.

A surface treatment method described in item 2 is a surface treatment method to form a coating film on a substrate having a rough shape; since a coating film is formed on the above-described rough shape by an atmospheric pressure plasma method, a film having very uniform thickness and characteristics can be formed along the rough shape of a deposition surface of a substrate; in addition, since it is not necessary to rotate a substrate nor to place a substrate in a vacuum atmosphere, which are required with a conventional technique, the manufacturing cost is decreased due to a depressed facility cost, and as well as a treatment efficiency is improved.

A surface treatment method described in item 3 is a surface treatment method to form a coating film on a substrate having a regular rough pattern; since a coating film is formed on the above-described regular rough pattern by an atmospheric pressure plasma method, a film having very uniform thickness and characteristics can be formed following the regular rough pattern of a deposition surface of a substrate; in addition, since it is not necessary to rotate a substrate nor to place a substrate in a vacuum atmosphere, which are required with a conventional technique, the manufacturing cost is decreased due to a depressed facility cost, and as well as a treatment efficiency is improved.

Herein, "a substrate" in the detailed description of the invention means those themselves being provided with or formed into a curved surface, a rough shape or a regular rough pattern (for example, a diffraction grating of a ring band shape), and the shapes do not indicate a shape formed quite randomly, for example, by particles other than a substrate.

In a surface treatment method described in item 4, the above-described coating film is preferably a half-mirror film, an anti-reflection film, an electric conductive film, a hard coating film or a filtering film.

In a surface treatment method described in item 5, the above-described substrate is preferably constituted of resin to provide high productivity and an excellent optical capabilities, as well as to improve an adhesion property and to enhance adhesion strength, between the substrate and the films.

In a surface treatment method described in item 6, the above-described substrate is preferably constituted of acrylic type, polycarbonate type, polyethylene type, polyolefin type or polystyrene type resin.

In a surface treatment method described in item 7, the above-described substrate is preferably constituted of amorphous polyolefin type resin, to be able to further increase film hardness and to form a more minute film.

In a surface treatment method described in item 8, the above-described substrate is preferably constituted of glass.

In a surface treatment method described in item 9, a lens having higher functions is provided when the above-described substrate is a lens.

In a surface treatment method described in item 10, a light guide plate having higher functions is provided when the above-described substrate is a light guide plate.

In a surface treatment method described in item 11, the above-described coating film is preferably a dielectric film.

In a surface treatment method described in item 12, the above-described dielectric film preferably has a carbon content of from 0.2 to 5 weight %.

In a surface treatment method described in item 13, the above-described dielectric film is preferably comprised of at least a layer of which a main component is silicon oxide and a layer of which a main component is titanium oxide, tantalum oxide, zirconium oxide, silicon nitride, indium oxide or aluminum oxide, being accumulated.

In a surface treatment method described in item 14, because the above-described atmospheric pressure plasma treatment method has a process of supplying electric power at a high frequency voltage over 100 kHz and of over 1 W/cm$^2$ between electrodes and causing discharge between the electrodes, a film having more uniformity and minuteness as well as an enhanced adhesive property with a substrate can be formed.

In a surface treatment method described in item 15, the above-described high frequency voltage is preferably a continuous sine wave to be able to form a more uniform and minute film on a deposition surface of the substrate.

In a surface treatment method described in item 16, the above-described atmospheric pressure plasma treatment method preferably causes discharge between electrodes opposing to each other under atmospheric pressure or the vicinity thereof and has a process to make a plasma state of a reactive gas or of a gas mixture containing a reactive gas and an inert gas which are introduced between the electrodes, to form a more uniform and minute film on a deposition surface of the substrate.

An optical part described in item 17, because being provided with a coating film formed by the above-described surface treatment method, can exhibit enhanced functions. Herein, optical parts are considered to include, for example, a lens, a prism, a diffraction grating optical part (such as a diffraction lens, a diffraction prism and a diffraction plate), an optical filter (such as a spatial low-pass filter, a wavelength band pass filter, a wavelength low-pass filter and a wavelength high-pass filter), a polarizing filter (such as a photo detector, an optical rotation element and a polarizing separation prism), and a phase difference filter (such as a phase plate and a hologram), however, are not limited to those described above.

An optical part described in item 18 is characterized by being provided with a substrate having a curved surface and a coating film formed on the curved surface by an atmospheric pressure plasma method. The explanation of working effects of the invention is omitted because they are similar to those described in item 1.

An optical part described in item 19 is characterized by being provided with a substrate having a rough shape and a coating film formed on the rough shape by an atmospheric pressure plasma method. The explanation of working effects of the invention is omitted because they are similar to those described in item 2.

An optical part described in item 20 is characterized by being provided with a substrate having a regular rough pattern and a coating film formed on the regular rough pattern by an atmospheric pressure plasma method. The explanation of working effects of the invention is omitted because they are similar to those described in item 3.

An optical part described in item 21 is characterized in that the above-described coating film is a half mirror, an anti-reflection film, an electric conductive film, a hard coat film or a filter film. The explanation of working effects of the invention is omitted because they are similar to those described in item 4.

An optical part described in item 22 is characterized in that the above-described substrate is comprised of resin. The explanation of working effects of the invention is omitted because they are similar to those described in item 5.

An optical part described in item 23 is characterized in that the above-described substrate is comprised of acrylic type, polycarbonate type, polyethylene type, polyolefin type or polystyrene type resin. The explanation of working effects of the invention is omitted because they are similar to those described in item 6.

An optical part described in item 24 is characterized in that the above-described substrate is comprised of amorphous polyolefin resin. The explanation of working effects of the invention is omitted because they are similar to those described in item 7.

An optical part described in item 25 is characterized in that the above-described substrate is comprised of glass. The explanation of working effects of the invention is omitted because they are similar to those described in item 8.

The optical part described in item 26 is characterized in that the above-described substrate is a lens. The explanation of working effects of the invention is omitted because they are similar to those described in item 9.

An optical part described in item 27 is characterized in that the above-described substrate is a light guide plate. The explanation of working effects of the invention is omitted because they are similar to those described in item 10.

An optical part described in item 28 is characterized in that the above-described coating film is a dielectric film. The explanation of working effects of the invention is omitted because they are similar to those described in item 11.

An optical part described in item 29 is characterized in that the above-described dielectric film has a carbon content of from 0.2 to 5 weight %. The explanation of working effects of the invention is omitted because they are similar to those described in item 12.

An optical part described in item 30 is characterized in that the above-described dielectric film is comprised of at least a layer of which main component is silicon oxide and a layer of which main component is titanium oxide, tantalum oxide, zirconium oxide, silicon nitride, indium oxide or aluminum oxide, being accumulated. The explanation of working effects of the invention is omitted because they are similar to those described in item 13.

An optical part described in item 31 is characterized in that the above-described atmospheric pressure plasma treatment method has a process of supplying electric power at a high frequency voltage over 100 kHz and of over 1 W/cm$^2$ between electrodes and causing discharge between the electrodes. The explanation of working effects of the invention is omitted because they are similar to those described in item 14.

An optical part described in item 32 is characterized in that the above-described high frequency voltage is a continuous sine wave. The explanation of working effects of the invention is omitted because they are similar to those described in item 15.

An optical part described in item 33 is characterized in that the above-described atmospheric pressure plasma treatment method preferably causes discharge between electrodes opposing to each other under atmospheric pressure or the vicinity thereof and has a process to make a plasma state of a reactive gas or a gas mixture containing a reactive gas and an inert gas, which are introduced between the electrodes, to be able to perform a deposition treatment exhibiting enhanced functions on the optical part.

DETAILED DESCRIPTION OF THE PREFERRED EMBODIMENT

Figure 1:
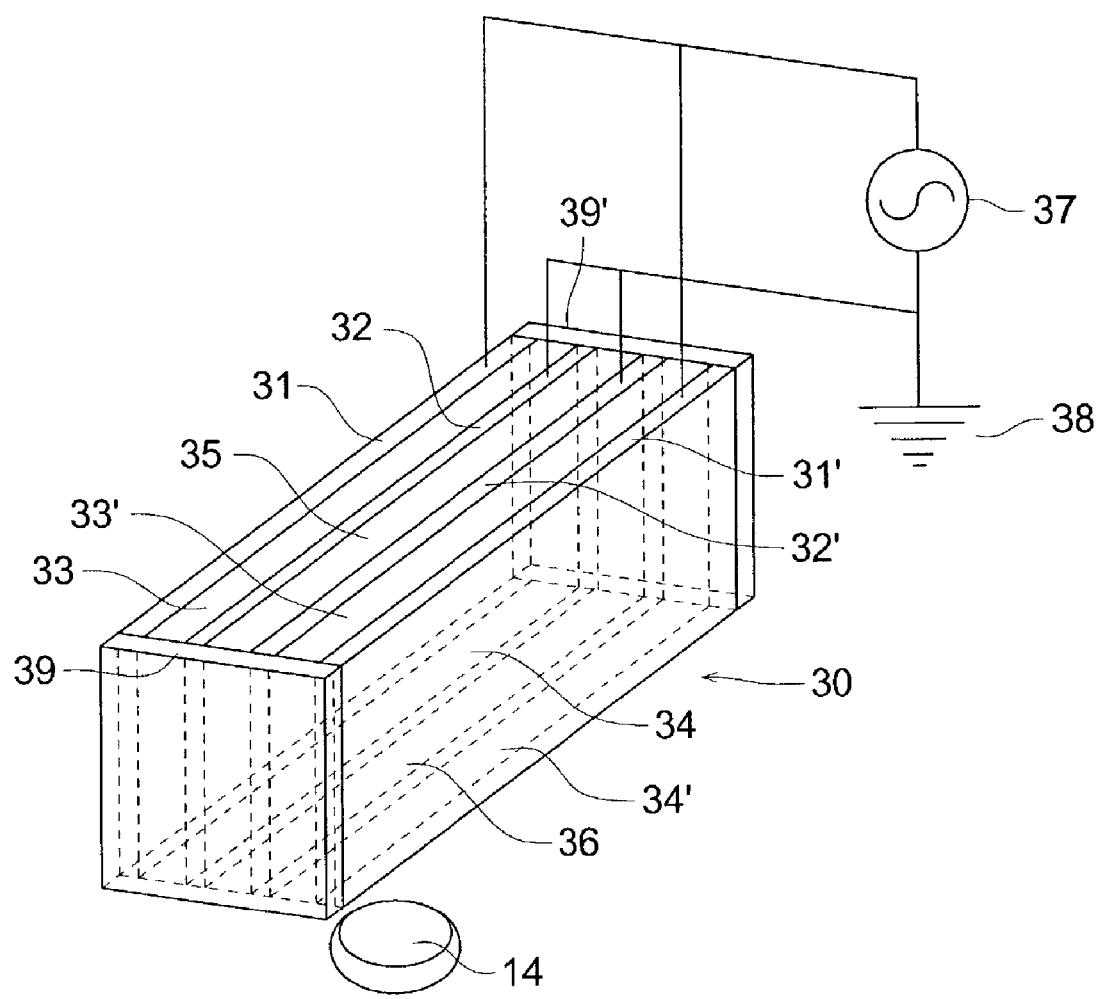
FIG. 1 is an oblique view of plasma treatment apparatus 30.

In what follows, embodiments of the invention will be explained in reference to drawings. FIG. 1 is an oblique view drawing showing plasma treatment apparatus 30 for performing a surface treatment method by means of an atmospheric plasma method to deposit a film. In FIG. 1, 31, 32, 31' and 32' are plate electrodes having a rectangular shape of the same size, and plate electrodes 31 and 32 are arranged opposing to each other, as well as plate electrodes 31' and 32'. Further, plate electrodes 32 and 32' are also arranged opposing to each other. Each plate electrode is arranged so that each four corner is put in order. Planes opposing each other of plate electrodes 31 and 32, and of plate electrodes 31' and 32', are coated with a dielectric, and the dielectric is prepared by a sealing treatment by alkoxy silane after sputtering of $Al_2O_3$ ceramic.

Herein, at least one of planes opposing to each other of plate electrodes 31 and 32, and at least one of planes opposing to each other of plate electrodes 31' and 32' are coated with a dielectric, and the apparatus may be constituted in such a manner.

As electrode materials, metals such as silver, platinum, stainless steel, aluminum and iron can be utilized. Stainless steel is preferably utilized due to easy manufacturing. As dielectrics, such as silicate type glass, borate type glass, phosphate type glass, germanate type glass, tellurite glass, aluminate glass and vanadate glass can be utilized. Among them, borate type glass is easy in manufacturing. Further, it is also preferable to utilize a ceramic made of sintered ceramics having a high air-tight property and a high heat resistance. Materials for ceramics include, for example, ceramics of an alumina type, a ziruconia type, a silicon nitride type and a silicon carbide type; among them, an alumina type ceramic is preferable and specifically $Al_2O_3$ among alumina type ceramics is preferably utilized. A thickness of an alumina type ceramic is preferably approximately 1 mm, and a volume specific resistance is preferably not lower than $10^8$ $\Omega \cdot cm$.

A ceramic is preferably an inorganic material having been subjected to a sealing treatment, and durability of an electrode can be improved thereby.

A sealing treatment of a ceramic can be performed with a metal oxide having a uniform structure, by coating a sol of which a main raw material is a metal alkoxide as a sealing agent on a ceramic, followed by being gelled and cured to form a strong three dimensional bonding.

An energy treatment is preferably performed to accelerate a sol-gel reaction. By an energy treatment on a sol, a three-dimensional bonding of metal-oxygen-metal can be accelerated.

An energy treatment is preferably a plasma treatment, a heat treatment at not higher than 200° C. or an UV treatment.

Openings opposing to each other among openings between plate electrodes 31, 32, between plate electrodes 31' and 32', and between plate electrodes 32 and 32' are shut by cover members 39 and 39'. Since plate electrodes 31, 32, 31' and 32' are rectangular plate electrodes, each opening between plate electrodes 31 and 32, between plate electrodes 31' and between 32', and plate electrodes 32 and 32', opposing to each other respectively, have openings in four sides.

33 and 33' are inert gas introducing inlets to introduce an inert gas between electrodes 31 and 32, and between electrodes 31' and 32'; and one side of openings opposing to each other, among openings between electrodes 31 and 32, and between electrodes 31' and 32', which are not shut by cover members 39 and 39', are utilized as inert gas introducing inlets 33 and 33'. Inert gas introducing inlet 33 and inert gas introducing inlet 33' utilize openings in the same direction.

In atmospheric pressure plasma treatment apparatus 30 of FIG. 1, inert gas introducing inlets 33 and 33' utilize parts of openings between electrodes 31 and 32, and between 31' and 32', as inert gas introducing inlets 33 and 33' as they are, however, it is preferable to make inert gas introducing inlets 33 and 33' in a shape capable of introducing an inert gas efficiently and easily between plate electrodes 31 and 32 and between plate electrodes 31' and 32', by further providing a member in the openings. 34 and 34' are excited inert gas ejecting outlets to eject an excited inert gas generated between electrodes 31 and 32 and between electrodes 31' and 32' to outside of between electrodes 31 and 32 and of between electrodes 31' and 32', and openings opposing to inert gas introducing inlets 33 and 33' among openings between electrodes 31 and 32 and between electrodes 31' and 32' are utilized as excited inert gas ejecting outlets 34 and 34'. Therefore, excited inert gas ejecting outlet 34 utilizes an opening in the same direction as excited inert gas ejecting outlet 34'.

In atmospheric pressure plasma treatment apparatus 30 of FIG. 1, excited inert gas ejecting outlets 34 and 34' utilize parts of openings between electrodes 31 and 32, and between 31' and 32', as excited inert gas ejecting outlets 34 and 34' as they are, however, it is preferable to enable to adjust an ejection angle or an ejection strength at the time of ejecting an excited inert gas having been generated between plate electrodes 31 and 32 and between plate electrodes 31' and 32' to outside, by further providing a member such as a nozzle in the openings.

35 is a reactive gas introducing inlet to introduce a reactive gas between electrodes 32 and 32', and utilizes one side of openings opposing to each other among openings between electrodes 32 and 32', which is not shut by cover members 39 and 39'. Herein, reactive gas introducing inlet 35 utilizes an opening in the same direction as inert gas introducing inlets 33 and 33'.

In atmospheric pressure plasma treatment apparatus 30 of FIG. 1, inert gas introducing inlet 35 utilizes a part of openings between electrodes 32 and 32' as inert gas introducing inlet 35 as it is, however, it is preferable to make inert gas introducing inlet 35 in a shape capable of introducing an inert gas efficiently and easily between plate electrodes 32 and 32', by further providing a member in the opening.

36 is a reactive gas ejecting outlet to eject a reactive gas having been introduced between electrodes 32 and 32' to the outside of between electrodes 32 and 32', and utilizes a opening opposing to reactive gas introducing inlet 35 among openings between plate electrodes 32 and 32' as reactive gas ejecting outlet 36. Therefore, reactive gas ejecting outlet 36 utilizes an opening in the same direction as excited inert gas ejecting outlet 34 and 34'.

In atmospheric pressure plasma treatment apparatus 30 of FIG. 1, reactive gas ejecting outlet 36 utilizes a part of openings between electrodes 32 and 32' as reactive gas ejecting outlet 36 as it is, however, it is preferable to enable to adjust an ejection angle or an ejection strength at the time of ejecting a reactive gas being present between plate electrodes 32 and 32' to the outside, by further providing a member such as a nozzle in the opening.

As described above, reactive gas ejecting outlet 36, excited gas ejecting outlets 34 and 34' utilize openings in the same direction, and the constitution is that reactive gas ejecting outlet 36 is sandwiched by excited gas ejecting outlet 34 and excited gas ejecting outlet 34'. Therefore, a reactive gas ejected from reactive gas ejecting outlet 36 is brought in contact being sandwiched with excited inert gas ejected from excited inert gas ejecting outlet 34 and excited inert gas ejected from excited inert gas ejecting outlet 34'. Thereby, a reactive gas is efficiently brought into a plasma state.

In the embodiment, the constitution is comprised of one reactive gas ejecting outlet being sandwiched by two excited gas ejecting outlets, however, it may also possible to newly provide a pair of plate electrodes to eject an excited inert gas, and to newly provide a reactive gas ejecting outlet between them, resulting in a constitution in which an excited inert gas ejecting outlet, a reactive gas ejecting outlet, an excited inert gas ejecting outlet, a reactive gas ejecting outlet, and an excited inert gas ejecting outlet are arranged in order from the end so as to make a reactive gas ejecting outlet being sandwiched.

A reactive gas utilized in the invention preferably includes an organofluoride compound and a metal compound. By utilizing an organofluoride compound, a low refractive index layer useful for an anti-reflection layer and an anti-staining layer can be formed. With a metal compound, a low refractive index layer, a medium refractive index layer, a high refractive index layer, a gas barrier layer, an anti-static layer and a transparent conductive layer can be formed.

An organofluoride compound is preferably a gas of such as carbon fluoride and hydrocarbon fluoride, and includes carbon fluoride compounds such as fluoromethane, fluoroethane, tetrafluoromethane, hexafluoroethane, 1,1,2,2-tetrafluoroethylene, 1,1,1,2,3,3-hexafluoropropane, hexafluoropropene and 6-fluoropropyrene; hydrocarbon fluoride compounds such as 1,1-difluoroethylene, 1,1,1,2-tetrafluoroethane and 1,1,2,2,3-pentafluoropropane; hydrocarbon chlorofluoride compounds such as difluorodichloromethane and trifluorochloromethane; fluoroalcohols such as 1,1,1,3,3,3-hexafluoro-2-propanol and 1,3-difluoro-2-propanol and perfluorobutanol; carboxylic acid ester fluorides such as vinyl trifluoroacetate and 1,1,1-trifluoroethyl trifluoroacetate; and ketone fluorides such as acetyl fluoride, hexafluoroacetone and 1,1,1-trifluoroacetone; however, is not limited thereto.

As an organofluoride compound, a compound which does not generate a corrosive gas or a harmful gas by a plasma discharge treatment is preferably selected, however, it is also possible to select a condition not to produce such gases. In case of utilizing an organofluoride compound as a useful reactive gas in the invention, an organofluoride compound which is a gas at ordinary temperatures and pressures is preferable because it can be used as it is as the most suitable reactive gas composition to achieve an object. On the other hand, in case of an organofluoride compound being a liquid or a solid at ordinary temperatures and pressures, it may be utilized by being vaporized by means of a vaporizing device of such as heat or reduced pressure, or may be utilized by being dissolved in a suitable organic solvent to be sprayed or vaporized.

A metallic compound includes a metallic compound or an organometallic compound of such as Al, As, Au, B, Bi, Ca, Cd, Cr, Co, Cu, Fe, Ga, Ge, Hg, In, Li, Mg, Mn, Mo, Na, Ni, Pb, Pt, Rh, Sb, Se, Si, Sn, Ti, V, W, Y, Zn or Zr; Al, Ge, In, Sb, Si, Sn, Ti, W, Zn or Zr is preferably utilized as a metallic compound, and a silicon compound, a titanium compound, a tin compound, a zinc compound, an indium compound, an aluminum compound, a copper compound and a silver compound are specifically preferable.

A silicon compound among them, for example, includes organometallic silicon compounds including alkylsilanes such as dimethyl silane, tetramethyl silane and tetraethyl silane; and silicon alkoxides such as tetramethoxy silane, tetraethoxy silane, tetrapropoxy silane, dimethyldiethoxy silane, methyltrimethoxy silane and ethyltriethoxy silane; silicon hydride compounds such as monosilane and disilane; silicon halogenide compounds such as dichlorosilane, trichlorosilane and tetrachlorosilane; and other organosilanes, and any of them can be preferably utilized. Further, suitable combinations thereof can be also utilized. The above-described silicon compounds are preferably a silicon alkoxide, an alkylsilane and a silicon hydride compound in respect to handling and a silicon alkoxide is specifically preferable as an organosilicon compound because of no generation of corrosive and harmful gases and minimal contamination in a manufacturing process.

As a titanium compound, a tin compound, a zinc compound, an indium compound, an aluminum compound, a copper compound and a silver compound, preferable are an organometallic compound, a metal halogenide compound, a metal hydride compound and a metal alkoxide compound. Organic components of an organometallic compound are preferably an alkyl group, an alkoxide group and an amino group, and include such as tetraethoxy titanium, tetraisopropoxy titanium, tetrabutoxy titanium and tetradimethylamino titanium. An organotitanium compound, an organotin compound, an organozinc compound, an organoaluminum compound, an organocopper compound and an organosilver compound are highly useful to form a medium refractive index layer or a high refractive index layer. A metal halogenide compound includes such as dichlorotitanium, trichlorotitanium and tetrachlorotitanium, and, further, a metal hydride compound includes such as monotitane and dititane. In the invention, titanium type organometallic compounds can be preferably utilized.

As an inert gas, rare gases such as He and Ar are preferably utilized, a rare gas comprised of He and Ar being mixed is also preferable, and a ratio of an inert gas in a gas is preferably from 90 to 99.9 volume %. A ratio of Ar gas component in an inert gas is preferably increased in respect to generating atmospheric pressure plasma efficiently, and Ar gas component of from 90 to 99.9 volume % is preferably utilized also in view of a cost aspect.

Herein, hydrogen gas or oxygen gas may be utilized by being mixed in an inert gas at from 0.1 to 10 volume % based on an inert gas, and a hardness of a thin layer can be significantly improved by such assistant utilization.

37 is a high frequency power source to apply a high frequency voltage between electrodes 31 and 32 and between electrodes 31' and 32'. 38 is an earth, and electrodes 32 and 32' are grounded to earth 38.

An inert gas being present between plate electrodes 31 and 32, and between plate electrodes 31' and 32' is under atmospheric pressure or the vicinity thereof, and an inert gas is excited by applying a voltage between plate electrodes 31 and 32 and between plate electrodes 31' and 32' by use of high frequency power source 37 to generate an excited inert gas.

As shown in FIG. 1, material 14 (for example, an objective lens for an optical pick-up device of which an optical plane is provided with a fine rough pattern such as a ring band shaped diffraction grid (not shown in the drawing)) for an optical part is arranged downward of between electrodes of atmospheric pressure plasma treatment apparatus 30 by a transportation device not shown in the drawing. Material 14 for an optical part is arranged in a place to be contact with a reactive gas in a plasma state, which has been generated by making a reactive gas ejected from reactive gas ejecting outlet 36 be sandwiched and be brought into contacted with excited inert gases ejected from excited inert gas ejecting outlets 34 and 34', in a direction of a reactive gas ejecting direction of reactive gas ejecting outlet 36 and an excited inert gas ejecting direction of excited inert gas ejecting outlets 34 and 34', and a surface treatment (for example, such as deposition of an anti-reflection coat or deposition of a hard coat) is performed thereby.

More concretely, an inert gas is introduced from inert gas introducing inlets 33 and 33' to a space between electrodes 31 and 32, and to a space between electrodes 31' and 32', and is made to be present between electrodes 31 and 32, and between electrodes 31' and 32' under atmospheric pressure or the vicinity thereof. A high frequency voltage is applied between electrodes 31 and 32, and between electrodes 31' and 32' by high frequency power source 37, and make an inert gas being present between electrodes 31 and 32, and between electrodes 31' and 32' be excited to generate an excited inert gas. An excited inert gas generated between electrodes 31 and 32, and between electrodes 31' and 32', is pushed by an inert gas newly introduced from inert gas introducing inlets 33 and 33', and further, because openings of side directions of the electrodes are covered by cover members 39 and 39', is ejected from excited inert gas ejecting outlets 34 and 34' to outside of between electrodes 31 and 32, and of between electrodes 31' and 32'.

On the other hand, a reactive gas is introduced from reactive gas introducing inlet 35 to a space between electrodes 32 and 32'. A reactive gas introduced between electrodes 32 and 32', is pushed by a reactive gas newly introduced from reaction gas introducing inlet 35, and further, because openings of side directions of the electrodes are covered by cover members 39 and 39', is ejected from reactive gas ejecting outlet 36 to outside of between electrodes 32 and 32'.

A reactive gas ejected from reaction gas ejecting outlet 36 is brought into contact with excited inert gases ejected from excited inert gas ejecting outlet 34 and from excited inert gas ejecting outlet 34' in a manner of being sandwiched, so that a reactive gas is made into a plasma state and a desired deposition treatment is performed. Therefore, a uniform and minute film can be deposited under atmospheric pressure, even on an optical plane of material 14 which has a non-spherical curved plane, and further, with a rough pattern formed thereon.

Since atmospheric pressure plasma treatment apparatus 30 performs surface treatment of a substrate outside of between electrodes, not only a sheet form material such as a support but also various sizes and shapes of a material can be treated as material 14 of an optical part. For example, substrates of a shape having thickness such as a lens form and a spherical form can be subjected to a surface treatment.

An electrode system utilized in atmospheric pressure plasma treatment apparatus 30 of FIG. 1 is constituted of electrodes 31, 32, 31' and 32', and voltage is applied between electrodes 31 and 32, and between electrodes 31' and 32', however, it is preferable to provide plural such electrode systems in addition to provide an inert gas introducing inlet, an excited inert gas ejecting outlet, a reactive gas introducing inlet and a reactive gas ejection outlet for each electrode system so that a surface treatment of a substrate can be performed plural times. Thereby, material 14 of an optical part may be provided with plural deposition of different components (for example, an anti-reflection coating).

Figure 2:
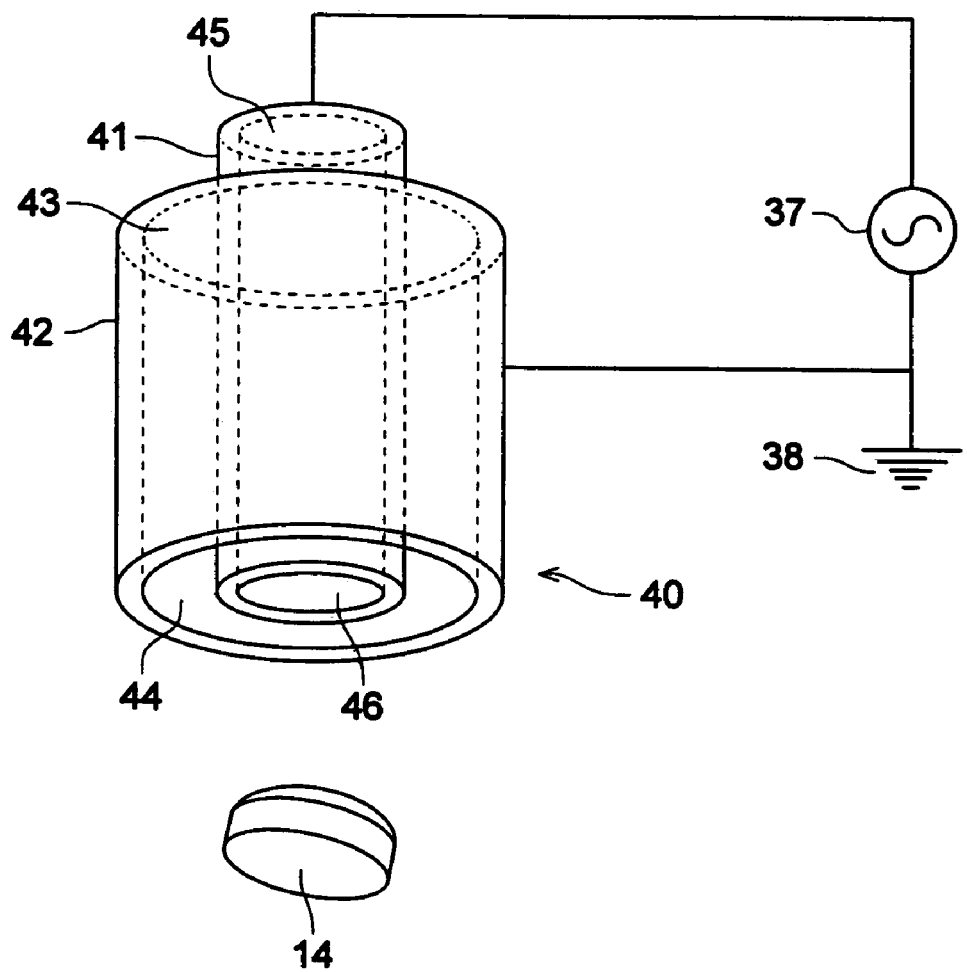
FIG. 2 is an oblique view of plasma treatment apparatus 40.

FIG. 2 is an oblique view drawing showing another atmospheric pressure plasma treatment apparatus 40. Herein, in the explanation of the following drawings, explanation and related explanation of the same symbols as those explained in the explanation of the above-described drawing may be omitted in some cases, however, they means the same as the explanation of the above-described drawing unless otherwise explained.

41 is an inside electrode and 42 is an outside electrode. Inside electrode 41 and outside electrode 42 are cylindrical electrodes and inside electrode 41 is arranged homocentrically in a cylinder of outside electrode 42.

In the embodiment, both surfaces opposing to each other of inside electrode 41 and outside electrode 42 are coated with a dielectric, however, it is satisfactory that a opposing surface of either of inside electrode 41 or outside electrode 42 is coated with a dielectric.

Figure 3:
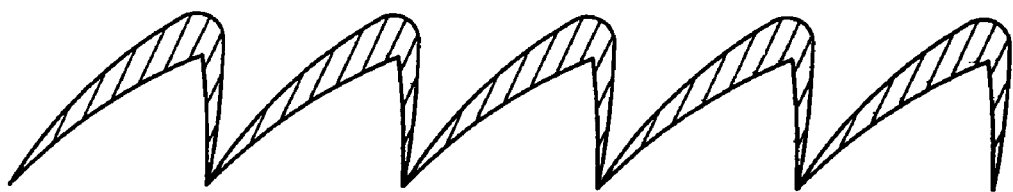
FIG. 3 is a cross sectional view of a lens deposited by means of a sputtering method.

An electrode and a dielectric utilized for electrodes 31, 32, 31' and 32' which were explained above in FIG. 3 can be utilized for inside electrode 41 and outside electrode 42. 43 is an inert gas introducing inlet to introduce an inert gas between inside electrode 41 and outside electrode 42. Between inside electrode 41 and outside electrode 42 means a region inside of the cylinder of outside electrode 42, excluding regions of inside electrode 41 and of the inside of the cylinder of inside electrode 41. Further, inert gas introducing inlet 43 applies one side of the openings between inside electrode 41 and outside electrode 42.

In atmospheric pressure plasma treatment apparatus 40 of FIG. 2, inert gas introducing inlet 43 utilizes a part of the opening between inside electrodes 41 and outside electrode 42 as inert gas introducing inlet 43 as it is, however, it is preferable to make inert gas introducing inlet 43 in a shape capable of introducing an inert gas efficiently and easily between inside electrode 41 and outside electrode 42, by further providing a member in the opening.

44 is an excited inert gas ejecting outlet to eject an excited inert gas generated between inside electrode 41 and outside electrode 42 toward outside of inside electrode 41 and outside electrode 42, and utilizes one of the openings between inside electrode 41 and outside electrode 42 which is not utilized as inert gas introducing inlet 43.

In atmospheric pressure plasma treatment apparatus 40 of FIG. 2, excited inert gas ejecting outlet 44 utilizes a part of openings between inside electrode 41 and outside electrode 42 as excited inert gas ejecting outlet 36 as it is, however, it is preferable to enable to adjust an ejection angle or an ejection strength at the time of ejecting an excited gas having been generated between inside electrode 41 and outside electrode 42 outside, by further providing a member such as a nozzle in the opening.

45 is a reactive gas introducing inlet to introduce a reactive gas into a cylinder of inside electrode 41, and utilizes one side of the openings of inside electrode 41 as reactive gas introducing inlet 45. Herein, reactive gas introducing inlet 45 utilizes an opening in the same direction as that of inert gas introducing inlet 43.

In atmospheric pressure plasma treatment apparatus 40 of FIG. 2, reactive gas introducing inlet 45 utilizes a part of the opening between inside electrode 41 as reactive gas introducing inlet 45 as it is, however, it is preferable to make reactive gas introducing inlet 45 in a shape capable of introducing an reactive gas efficiently and easily to inside the cylinder of inside electrode 41, by further providing a member in the opening of the cylinder.

46 is a reactive gas ejecting outlet to eject a reactive gas introduced inside a cylinder of inside electrode 41 to outside the cylinder, and utilizes one of the openings of inside electrode 41 which is not utilized as reactive gas introducing inlet 45. Therefore, reactive gas ejecting outlet 46 is in the same direction as excited inert gas ejecting outlet 44.

In atmospheric pressure plasma treatment apparatus 40 of FIG. 2, reactive gas ejecting outlet 46 utilizes a part of openings of a cylinder of inner electrode 41 as reactive gas ejecting outlet 46 as it is, however, it is preferable to enable to adjust an ejection angle or an ejection strength at the time of ejecting the reactive gas outside, by further providing a member such as a nozzle in the opening of the cylinder.

As described above, reactive gas ejecting outlet 46 and excited inert gas ejecting outlet 44 are provided in the same direction, and the structure is such that reactive gas ejecting outlet 46 is surrounded by excited inert gas ejecting outlet 44. Therefore, reactive gas ejected from reactive gas ejecting outlet 46 being enveloped and is brought into contact with an excited inert gas ejected from excited inert gas ejecting outlet 44. Thereby, a reactive gas is efficiently made into a plasma state.

In the embodiment, the constitution is comprised of one reactive gas ejecting outlet being surrounded by an excited gas ejecting outlet, however, it may also possible to newly provide an inside electrode and an outside electrode having a cylindrical form, as well as to provide a reactive gas ejecting outlet and an inert gas ejecting outlet, resulting in a constitution in which a reactive gas ejecting outlet, an excited inert gas ejecting outlet, a reactive gas ejecting outlet, and an excited inert gas ejecting outlet are arranged in order from the inside so as to make a reactive gas be brought into contact while being enveloped, with an excited inert gas, and which is further brought into contact while being sandwiched, with a reactive gas.

An electrode system utilized in atmospheric pressure plasma treatment apparatus 40 of FIG. 2 is constituted of inside electrode 41 and outside electrode 42, and voltage is applied between inside electrode 41 and outside electrode 42 by a high frequency power source 37, however, it is preferable to provide plural of such an electrode system in addition to provide an inert gas introducing inlet, an excited inert gas ejecting outlet, a reactive gas introducing inlet and a reactive gas ejecting outlet for each electrode system so that a surface treatment of a substrate can be performed plural times. Thereby, material 14 of an optical part may be provided with plural depositions of different components. This is useful to perform a deposition of such as an antireflection film, for example, by providing a low refractive index layer comprised of such as silicon oxide and a high refractive layer comprised of such as titanium oxide or silicon nitride.

Next, an atmospheric pressure plasma treatment method utilizing atmospheric pressure plasma treatment apparatus 40 illustrated in FIG. 2 will be explained. An inert gas is introduced from inert gas introducing inlet 43 to a opening between inside electrode 41 and outside electrode 42, and is made to be present between inside electrode 41 and outside electrode 42 under atmospheric pressure or the vicinity thereof. A high frequency voltage is applied between inside electrode 41 and outside electrode 42 by high frequency power source 37 and an inert gas being present between inside electrode 41 and outside electrode 42 is excited to generate an excited inert gas. An excited inert gas generated between inside electrode 41 and outside electrode 42 is ejected from between inside electrode 41 and outside electrode 42 to outside through excited inert gas ejecting outlet 44, in such a manner of being pushed by an inert gas newly introduced from inert gas introducing inlet 43.

On the other hand, a reactive gas is introduced from reactive gas introducing inlet 45 into inside the cylinder of inside electrode 41 and is ejected from reactive gas ejecting outlet 46. A reactive gas ejected from reactive gas ejecting outlet 46 is brought into contact, in such a manner of being enveloped, with an excited inert gas ejected from excited gas ejecting outlet 44 to be made into a plasma state.

Because material 14 of an optical part is placed under a opening between electrodes of atmospheric pressure plasma treatment apparatus 40 by a transport device which is not shown in the figure, a suitable surface treatment is provided on material 14 of an optical part. Also in this embodiment, uniform and minute film can be deposited under atmospheric pressure, even in case that an optical surface of material 14 is a non-spherical curved plane and has a rough pattern formed thereon.

A gas utilized for a surface treatment method of the invention differs depending on the kind of a thin film to be provided on a substrate, however, basically a gas mixture of an inert gas with a reactive gas to form a thin film. A reactive gas is contained at a ratio of from 0.01 to 10 volume % based on a gas mixture. A thickness of a thin film obtained is in a range of from 0.1 to 100 nm.

An inert gas described above includes elements in the 18th group of the periodic table, concretely helium, neon, argon, krypton, xenon and radon, however, helium and argon are preferably utilized to obtain effects described in the invention. Argon is most preferably utilized to form a thin film having minuteness and high precision. When argon is utilized, high density plasma is assumed to be generated. Argon gas is preferably contained at not less than 90 volume % based on 100 volume % of a gas mixture (a mixed gas of an inert gas and a reactive gas). It is further preferably not less than 95 volume %.

A reactive gas is made into a plasma state in a discharge space containing components to form a thin film, and is such as an organometalic compound, an organic compound or an inorganic compound.

For example, an electric conductive film or an anti-static film, or a metaloxide layer useful as medium refractive index layer of an anti-reflection film can be formed by utilizing a gas containing at least one organometalic compound selected from such as zinc acetylacetate, triethyl indium, trimethyl indium, diethyl zinc, dimethyl zinc, tetraethyl tin, tetramethyl tin, diacetyl-n-butyl tin, tetrabutyl tin and tetraoctyl tin, as a reactive gas.

Further, a water repellant film for preparing a water-repellant surface can be obtained by utilizing a gas of a fluorine-containing compound to form a fluorine-containing group on the surface of a substrate and to lower the surface energy. A fluorine-containing compound includes fluorocarbon compounds such as hexafluoropropylene ($CF_3CFCF_2$) and octafluorocyclobutane ($C_4F_8$). Hexafluoropropylene and octafluorocyclobutane, which do not produce hydrogen fluoride as a harmful gas, can be utilized in respect to safety.

Further, a hydrophilic polymerized film also can be deposited by performing a treatment under environment of a monomer having a hydrophilic group and a polymerizing unsaturated bond in a molecule. The above-described hydrophilic group includes such as a hydroxide group, a sulfonic acid group, a sulfonate group, a primary, secondary or thirdly amino group, amide group, a quarterly ammonium group, a carboxylic acid group and a carboxylate group. Further, a hydrophilic polymer film can be also deposited similarly by use of a monomer having a polyethylene glycol chain.

The above-described monomer includes such as acrylic acid, methacrylic acid, acrylamide, methacrylamide, N,N-dimethyl acrylamide, sodium acrylate, sodium methacrylate, potassium acrylate, potassium methacrylate, sodium stylene sulfonate, allyl alcohol, allyl amine, polyethylene glycol dimethacrylic acid ester and polyethyleneglycol diacrylic acid ester and at least one kind thereof can be utilized.

A low refractive index layer or a high refractive index layer of an anti-reflection film can be provided by utilizing a reactive gas containing an organofluorine compound, a silicon compound or a titanium compound.

As an organofluorine compound, a carbon fluoride gas and a hydrocarbon fluoride gas are preferably utilized. A carbon fluoride gas includes tetrafluorocarbon and hexafluorocarbon, concretely, such as tetrafluoromethane, tetrafluoroethylene, hexafluoropropylene and octafluorocyclobutane. The above-described hydrocarbon fluoride gas includes such as difluoromethane, tetrafluoroethane, tetrafluoropropylene and trifluoropropylene.

Further, halogenide compounds of a hydrocarbon fluoride compound such as monochlorotrifluoromethane, monochlorodifluoromethane and dichlorotetrafluorocyclobutane, fluorine substituents of organic compounds such as alcohols, acids and ketones can be utilized, however the invention is not limited thereto. Further, these compounds may have an ethylenically unsaturated group in a molecule. The above-described compounds may be utilized alone or in combinations.

In case of utilizing the above-described organofluoride compound in a gas mixture, a content of an organofluoride compound in a gas mixture is preferably from 0.1 to 10 volume % and more preferably from 0.1 to 5 volume %, in respect to forming a uniform thin film on a substrate by means of a plasma discharge treatment.

Further, in case of an organofluoride compound according to the invention being a gas under ordinary temperature and pressure, a method of the invention can be most easily performed because it can be utilized as a constituent component as it is. However, in case of an organofluoride compound according to the invention being a liquid or a solid under ordinary temperature and pressure, it may be utilized by being vaporized by means of heating or reduced pressure, or by being dissolved in a suitable solvent.

In case of utilizing the above described titanium compound in a gas mixture, a content of a titanium compound in a gas mixture is preferably from 0.01 to 10 volume % and more preferably from 0.01 to 5 volume %, in respect to forming a uniform thin film on a substrate by means of a plasma discharge treatment.

Further, a metal hydride compound, a metal halogenide compound, a metal hydroxide compound and a metal peroxide compound can be also utilized as a reactive gas, and they are utilized by being suitably vaporized.

Further, hardness of a thin film can be significantly improved by containing from 0.1 to 10 volume % of hydrogen gas in the above-described gas mixture.

Further, a reaction can be accelerated as well as a thin film having minuteness and excellent quality can be formed, by containing from 0.01 to 5 volume % of a component selected from oxygen, ozone, hydrogen peroxide, carbon dioxide, carbon monoxide, hydrogen and nitrogen, in a gas mixture.

As the above-described silicon compound and titanium compound, preferable are a metal hydride compound and a metal alkoxide compound in respect to handling, and a metal alkoxide is preferably utilized because of no generation of a corrosive and harmful gas and minimal contamination in a manufacturing process.

Further, to introduce the above-described silicon compound or titanium compound between electrodes as a discharge space, both may be any state of a gas, liquid and solid under ordinary temperature and pressure. In case of a gas, it can be introduced as it is, however, in case of a liquid or solid, it can be utilized by being vaporized by means of such as heating, reduced pressure or ultrasonic irradiation. When a silicon compound or a titanium compound is utilized by being evaporated by means of heating, metal alkoxides, which are liquids under ordinary temperature and have a boiling point of not higher than 200° C., such as tetraethoxy silane and tetraisopropoxy titanium can be suitably utilized to form an anti-reflection film. The above described metal alkoxides may be utilized by being diluted by use of solvents, and organic solvents such as methanol, ethanol and n-hexane and mixed solvents thereof can be utilized as the solvent. Herein, the effects of these diluting solvents on such as formation of a thin film on a substrate and a composition of a thin film can be almost neglected, because the solvents are decomposed into molecules or atoms during a plasma discharge treatment.

As the above-described silicon compounds, for example, organometallic compounds such as dimethyl silane and tetramethyl silane; metal hydride compounds such as monsilane and disilane; metal halogenide compounds such as dichloro silane and trichloro silane: alkoxy silanes such as tetramethoxy silane, tetraethoxy silane and dimethyldiethoxy silane; and organosilanes can be utilized, however, the invention is not limited thereto. They can be also utilized in suitable combinations.

In case of utilizing the above-described silicon compounds in a gas mixture, a content of a silicon compound in a gas mixture is preferably from 0.1 to 10 volume % and further preferably from 0.1 to 5 volume %, in respect to forming a uniform thin film on a substrate by a plasma discharge treatment.

As the above described titanium compound, organometallic compounds such as tetradimethylamino titanium, metal hydride compounds such as monotitane and dititane, metal halogenide compounds such as dichloro titanium, trichloro titanium and tetrachloro titanium, metal alkoxides such as tetraethoxy titanium, tetraisopropoxy titanium and tetrabutoxy titanium are preferably utilized, however, the invention is not limited thereto.

In case of adding an organometallic compound in a reactive gas, for example, the organometallic compound can contains a metal selected from Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb and Lu. The organometallic compounds are more preferably selected from metal alkoxides, alkyl metals and metal complexes.

By applying a reactive gas, suitably selected from the above-described or other reactive gases, to a thin film forming method of the invention, various highly functional thin films can be obtained. Examples are shown below, however, the invention is not limited thereto.

Electrode film: Au, Al, Ag, Ti, Tl, Pt, Pt, Mo, Mo—Si
Dielectric protective film: $SiO_2$, SiO, $Si_3N_4$, $Al_2O_3$, $Al_2O_3$, $Y_2O_3$
Transparent conductive film: $In_2O_3$, $SnO_2$
Electrochromic film: $WO_3$, $IrO_2$, $MoO_3$, $V_2O_5$
Fluorescent film: ZnS, ZnS+ZnSe, ZnS+CdS
Magnetic recording film: Fe—Ni, Fe—Si—Al, $\gamma$-$Fe_2O_3$, Co, $Fe_3O_4$, Cr, $SiO_2$, $Al_2O_3$
Super-conductive film: Nb, Nb—Ge, NbN
Solar battery film: a-Si, Si
Reflective film: Ag, Al, Au, Cu
Selective absorption film: ZrC—Zr
Selective transmission film: $In_2O_3$, $SnO_2$
Anti-reflection film: $SiO_2$, $TiO_2$, $SnO_2$
Shadow mask: Cr
Anti-abrasion film: Cr, Ta, Pt, TiC, TiN
Anti-corrosion film: Al, Zn, Cd, Ta, Ti, Cr
Heat resistant film: W, Ta, Ti
Lubricant film: $MoS_2$
Decoration film: Cr, Al, Ag, Au, TiC, Cu Next, a substrate applicable in the invention will be explained.

As a substrate applicable in the invention is not limited provided that a thin film can be formed on the surface thereof, for example, of a stereoscopic form such as a lens form. A thin film may be formed, by mounting a substrate between electrodes when a substrate can be mounted between electrodes, and by spraying a generated plasma onto the substrate when a substrate cannot be mounted between electrodes.

A material comprising a substrate is not limited specifically, and resin can be preferably utilized because of a treatment is performed under atmospheric pressure or the vicinity and by low temperature glow discharge.

Further, as the substrates, a substrate on which a anti-glare layer or a clear hard coat layer is coated, or a back-coat layer or a anti-static layer is coated, can be utilized.

The above described substrates concretely include polyester substrates such as polyethylene terephthalate, polyethylene naphthalate, a polyethylene substrate, a polypropylene substrate, cellophane, a cellulose diacetate substrate, a cellulose acetate butylate substrate, a cellulose acetate propionate substrate, a cellulose acetate phthalate substrate, substrates comprised of cellulose esters such as cellulose triacetate and cellulose nitrate or derivatives thereof, a polyvinylidene chloride substrate, a polyvinyl alcohol substrate, an ethylene vinylalcohol substrate, a syndiotactic polystyrene type substrate, a polycarbonate substrate, a norbornene resin type substrate, a polymethylpentene substrate, a polyether ketone substrate, polyimide substrate, a polyether sulfon type substrate, a polysulfon type substrate, a polyether ketoneimide substrate, a polyamide substrate, a fluorine-contained resin substrate, a nylon substrate, an acrylic substrate or a polyallylate type substrate, a polyolefin type substarte (specifically preferably an amorphous polyolefin type substrate) and glass. Further, those, on which a rough shape comprised of actinic ray curable resin or heat-curable resin having been formed, also can be utilized as a substrate.

These materials can be utilized alone or in suitably mixed combinations. Among them, products available on the market such as APEL (manufactured by Mitsui chemicals Co., Ltd.), ZEONEX (manufactured by Nippon Zeon Co., Ltd.) and ARTON (manufactured by JSR Co., Ltd.) are preferably utilized. Further, materials having a large specific double refractive index such as polycarbonate, polyallylate, polysulfon and polyether sulfon are also utilized.

In the invention, in respect to improving adhesion between a substrate and a thin film formed by a plasma discharge treatment, it is preferable to form a thin film by the above-described plasma discharge treatment on a layer formed by polymerizing a composition containing at least one kind of an ethylenically unsaturated monomer, and it is specifically preferable to improve adhesion that the layer formed by polymerizing a composition containing an ethylenically unsaturated monomer is subjected to a plasma discharge treatment after having been treated by a solution of pH of not lower than 10. A solution having a pH of not lower than 10 utilized is preferably an aqueous solution of sodium hydroxide or potassium hydroxide of from 0.1 to 3 mol/L.

As a resin layer formed by polymerizing a component including an ethylenically unsaturated monomer, a layer containing an actinic ray curable resin or a heat curable resin as a constituting component is preferably utilized and specifically preferably utilized is an actinic ray curable resin layer.

Herein, an actinic ray curable resin layer refers to a layer of which main component is a resin curable via such as a cross-linking reaction by irradiation of actinic rays such as ultraviolet rays and electron rays. An actinic ray curable resin includes a ultraviolet ray curable resin and an electron ray curable resin as a typical resin, however, may be a resin curable by actinic rays other than ultraviolet rays and electron rays. An ultraviolet ray curable resin can include, for example, such as a ultraviolet ray curable acrylurethane type resin, a ultraviolet ray curable polyester acrylate type resin, a ultraviolet ray curable epoxy acrylate type resin, a ultraviolet ray curable polyol acrylate type resin or a ultraviolet ray curable epoxy resin.

An ultraviolet ray curable acrylurethane resin can be easily obtained generally by reacting a polyester polyol with an isocyanate monomer or prepolymer, and by further reacting the product with an acrylate type monomer having a hydroxyl group such as 2-hydroxyethyl methacrylate (hereinafter, only acrylate is described as to include also methacrylate) and 2-hydroxypropyl acrylate (refer to, for example, JP-A No. 59-151110 (hereinafter, JP-A refers to Japanese Patent Publication Open to Public Inspection)).

An ultraviolet curable polyester acrylate type resin can be easily obtained generally by reacting a polyester polyol with a monomer of a 2-hydroxyethyl acrylate type or a 2-hydroxy acrylate type (refer to, for example, JP-A No. 59-151112).

Concrete examples of an ultraviolet ray curable epoxy acrylate type resin includes those in which an epoxyacrylate as an oligomer is added and reacted with a reactive diluent and a photo-initiator (for example, JP-A No. 1-105738). As the photo-initiator, one or not less than two kinds selected from such as benzoin derivatives, oxime ketone derivatives, benzophenone derivatives and thioxanthone derivatives can be utilized.

Further, concrete examples of an ultraviolet ray curable polyol acrylate type resin include such as trimethylolpropane triacrylate, ditrimethylolpropane tetraacrylate, pentaerythritol triacrylate, pentaerythritol tetraacrylate, dipentaerythritol hexaacrylate and alkyl modified dipentaerythritol pentaacrylate.

These resins are generally utilized together with a photosensitizer well known in the art. Further, the above-described photo-initiators can be utilized also as a photosensitizer. Concretely, acetophenone, Michler's ketone, α-amyloxime ester, thioxthanthon, etc., and derivatives thereof can be listed. Further, when using an epoxy acrylate type photoreactive agent, photo-sensitizers such as n-butylamine, triethyl amine and tri-n-butyl phosphine can be utilized. A photo reaction initiator or a photo-sensitizer contained in an ultraviolet ray curable resin composition, from which a volatile solvent components having been eliminated after coating and drying, is preferably from 2.5 to 6 weight % of the composition.

A resin monomer can includes, for example, general monomers such as methylacrylate, ethylacrylate, butylacrylate, vinylacetate, benzylacrylate, cyclohexylacrylate and styrene as a monomer having one unsaturated double bond. Further, ethyleneglycol diacrylate, propyleneglycol diacrylate, divynl benzene, 1,4-cyclohexyane diacrylate, 1,4-cyclohexyanedimethyl diacrylate, the above-described trimethilolpropane triacrylate and pentaerythritol tetraacrylester as a monomer having not less than two unsaturated double bonds.

For example, an ultraviolet ray curable resins can be utilized by suitably selecting from Adekaoptomer KR·BY Siries: KR-400, KR-410, KR-550, KR-566, KR-567 and BY-320B (all above are manufactured by Asahi Denka Kogyo K.K.); Koeihard A-101-KK, A-101-WS, C-302, C-410-N, C-501, M-101, M-102, T-102, D-102, NS-101, FT-102Q8, MAG-1-P20, AG-106 and M-101-C (all above are manufactured by Koei Chemicals Co., Ltd.); Seikabeam PHC2210 (S), PHC X-9 (K-3), PHC2213, DP-10, DP-20, DP-30, P1000, P1100, P1200, P1300, P1400, P1500, P1600 and SCR900 (all above are manufactured by of Dainichiseika Colour & Chemicals Mfg. Co., Ltd.); KRM7033, KRM7039, KRM7130, KRM7131, UVECRYL29201 and UVECRYL29202 (all above are manufactured by of Daicel UCP Co., Ltd.); RC-5015, RC-5016, RC-5020, RC-5031, RC-5100, RC-5102, RC-5120, RC-5122, RC-5152, RC-5171, RC-5180 and RC-5181 (all above are manufactured by Dainippon Ink & Chemicals Inc.); Aulex No. 340 Clear (manufactured by Chyugoku Toryo Co., Ltd.); Sunrad H-601 (manufactured by Sanyo Chemical Industries Ltd.); SP-1509 and SP-1507 (manufactured by Showa Highpolymer Co., Ltd.); RCC-15C (manufactured by Grace Japan Co., Ltd.); Aronix M-6100, M-8030 and M-8060 (all above are manufactured by Toagosei Co., Ltd.) or others available on the market.

An actinic ray curable resin layer utilized in the invention can be coated by a method well known in the art. As a light source to form a cured film layer by photo-curing reaction of an actinic ray curable resin, any light source generating ultraviolet rays can be utilized. For example, such as a low pressure mercury lamp, a medium pressure mercury lamp, a high pressure mercury lamp, a carbon arc lamp, a metal halide lamp and a xenon lamp can be utilized. Irradiation conditions may differ depending on each lamp, however, an irradiation amount is approximately from 20 to 10000 mJ/cm$^2$ and preferably from 50 to 2000 mJ/cm$^2$. A region from near-ultraviolet rays to visible rays can be utilized by incorporating a photo-sensitizer having a maximum absorption in the region.

As solvents for coating an actinic ray curable resin layer, solvents for coating a back coating layer or a resin layer containing electric conductive fine particles can be utilized, for example, by suitably selecting from a hydrocarbon series and other solvents or by mixing these solvents. Solvents containing not less than 5 weight % and more preferably from 5 to 80 weight % of propylene glycol monoalkyl ether (alkyl group having 1 to 4 carbon atoms) or propyleneglycol monoalkylether (alkyl group having 1 to 4 carbon atoms) ester can be utilized.

As a coating method of an ultraviolet ray curable resin composition coating solution, methods well known in the art such as a gravure coater, a spinner coater, a wire-bar coater, a roll coater, a reverse coater, an extrusion coater and an air-doctor coater can be utilized. A coating amount is suitably from 0.1 to 30 μm and preferably from 0.5 to 15 μm, based on a wet film thickness.

An ultraviolet ray curable resin composition is irradiated with ultraviolet rays by a light source after having been coated and dried, and an irradiation time is preferably from 0.5 seconds to 5 minutes and more preferably from 3 seconds to 2 minutes, in respect to curing efficiency and working efficiency of an ultraviolet curable resin.

A cured film layer thus obtained is preferably added with inorganic or organic fine particles to prevent blocking and to enhance an anti-abrasion property. For example, inorganic fine particles can include such as silicon oxide, titanium oxide, aluminum oxide, tin oxide, zinc oxide, calcium carbonate, barium sulfite, talc, kaolin and calcium sulfite, and organic fine particles can include such as polymethacrylic methylmethacrylate resin powder, acrylstyrene type resin powder, polymethylmethacrylate resin powder, silicone type resin powder, polystyrene type resin powder, polycarbonate resin powder, benzoguanamine type resin powder, melamine type resin powder, polyolefin type resin powder, polyester type resin powder, polyamide type resin powder, polyimide type resin powder and polyfluoroethylene type resin powder, which can be added in an ultraviolet curable resin composition. A mean particle diameter of these fine particle powder is preferably from 0.005 to 1 μm and specifically preferably from 0.01 to 0.1 μm.

A ratio of an ultraviolet ray curable resin composition to fine particles is desirably from 0.1 to 10 weight % based on 100 weight % of a resin composition.

A layer thus formed by curing an ultraviolet curable resin may be a clear hard coat layer having a mean center-line roughness Ra of from 1 to 50 nm or an anti-glare layer having a Ra of approximately from 0.1 to 1 μm. In the invention, a plasma treatment can be provided on these layers. Specifically, according to a method of the invention, a uniform optical interference layer comprised of such as a low refractive index layer or a high refractive index layer on a substrate having a rough surface.

In the invention, a material to deposit a metal oxide film applied for anti-reflection layer preferably provided with a high refractive index layer comprised of titanium oxide as a main component having a refractive index of from 1.6 to 2.4. In addition, further a low refractive index layer comprised of silicon oxide as a main component having a refractive index of from 1.3 to 1.5 is preferably provided in succession on a substrate surface. Thereby, adhesion between each layer becomes excellent. It is more preferable to provide a high refractive index layer and a low refractive index layer by a plasma treatment immediately after an ultraviolet curable resin layer has been provided on a substrate.

Further, the above-described layer comprised of titanium oxide as a main component preferably has a refractive index of not lower than 2.2. Further, by utilizing a thin film forming method of the invention, it comes to be possible to form a metal oxide layer having such a high refractive index.

Further, in a metal oxide thin film such as comprised of titanium oxide as a main component, a content of carbon in the thin film is preferably from 0.1 to 5 weight % for an adhesion property with the under layer and film flexibility. It is more preferably from 0.2 to 5 weight % and furthermore preferably from 0.3 to 3 weight %. The carbon content is preferably similar also in case of the above-described low refractive index layer comprised of silicon oxide as a main component.

The carbon content range is preferable not only in the above-described metal oxides of such as an anti-reflection film but also in metals, metal oxides, metal nitrides and metal borides having other applications and functions. It is because, a thin film formed by utilizing a reactive gas containing an organic substance and by means of a plasma treatment can easily be made into a thin film of the above carbon content, due to containing carbon atoms. Not limiting to a thin film formed by means of a plasma treatment, a thin film having this range of a carbon content is preferable for its excellent adhesion property of a film because the carbon content itself provides a film with flexibility. Cracks are liable to be caused when a carbon content is too small, and on the contrary it is not preferable that a refractive index may varies by aging or an anti-abrasion property may deteriorated when it becomes too large.

Next, an example to form a half mirror film on a substrate will be explained. A half mirror film is considered being divided roughly into two kinds, and one kind is a metal thin film of such as Au, Ag, Cu, Pt, Ni, Pd, Se, Te, Rh, Ir, Ge, Os, Ru, Cr or W; or an alloy semi-transparent mirror film comprised of the metal thin film accumulated with another metal thin film or a dielectric film (including accumulating not less than two layers). Another kind is a dielectric mirror film comprised of a dielectric film or of dielectric films having different refractive indexes accumulated (including accumulating not less than two layers).

An alloy semi-transparent mirror film has a large light absorption, for example, a transmission of 40%, a reflection of 50% and an absorption of 10%, and is not necessarily suitable to be applied in a semi-transparent type liquid crystal display device due to the large light loss of a back light source. On the other hand, a dielectric mirror film can be preferably utilized for various purposes, because of no such a light loss.

Further, capabilities as a half mirror film can be freely designed with respect to reflectance and transmittance by suitably selecting comprising materials and the film thickness. Specifically, a dielectric mirror film is comprised of accumulated layers of different refractive indexes, and can be provided with desired capabilities by accumulating approximately from a few to a few tens layers of a high refractive index layer and a low refractive index layer in succession and by designing refractive indexes and thickness of each layer.

As a high refractive index layer of a dielectric mirror film, those comprised of titanium oxide or tantalum oxide as a main component and having a refractive index n of $1.85 \leq n \leq 2.60$ are preferably utilized, and they may contain nitrogen, carbon, tin, nickel or niobium as an auxiliary component. Further, as a low refractive index layer, those comprised of silicon oxide or magnesium fluoride as a main component and having a refractive index n of $1.30 \leq n \leq 1.57$ are preferably utilized, and they may contain nitrogen, carbon, fluorine, boron or tin as an auxiliary component.

Among these components, those accumulating plural layers of a low refractive index layer comprised of silicon oxide layer ($SiO_2$) as a main component and a high refractive index layer comprised of titanium oxide layer ($TiO_2$) (or tantalum oxide, zirconium oxide, silicon nitride, indium oxide or aluminum oxide) as a main component, can be preferably utilized. For example, a multi-layered film in which $TiO_2$ (refractive index, n=2.35) and $SiO_2$ (refractive index, n=1.46) are accumulated alternately can be utilized.

For example, in case of applying an optical part provided with a dielectric half mirror film between a back light and a liquid crystal in a semi-transparent type liquid crystal display device, the following specifications can be listed as an example of a design of a dielectric half mirror film, however it is not limited thereto.

1. A design example in case of transmittance/reflectance=40/60 is shown in Table 1. It is comprised of total 13 layers of a low refractive index layer and a high refractive index layer in the order of layer numbers from 13 to 1 being accumulated on a glass substrate.

TABLE 1

| Layer number | Material | Refractive index | Extinction coefficient | Optical thickness |
|---|---|---|---|---|
| 1 | $TiO_2$ | 2.34867 | 0.00037 | 0.07648704 |
| 2 | $SiO_2$ | 1.46180 | 0.00000 | 0.13459754 |
| 3 | $TiO_2$ | 2.34867 | 0.00037 | 0.31283745 |
| 4 | $SiO_2$ | 1.46180 | 0.00000 | 0.11558490 |
| 5 | $TiO_2$ | 2.34867 | 0.00037 | 0.21469850 |
| 6 | $SiO_2$ | 1.46180 | 0.00000 | 0.15640022 |
| 7 | $TiO_2$ | 2.34867 | 0.00037 | 0.33493599 |
| 8 | $SiO_2$ | 1.46180 | 0.00000 | 0.28253394 |
| 9 | $TiO_2$ | 2.34867 | 0.00037 | 0.28877475 |
| 10 | $SiO_2$ | 1.46180 | 0.00000 | 0.35592376 |
| 11 | $TiO_2$ | 2.34867 | 0.00037 | 0.32675487 |
| 12 | $SiO_2$ | 1.46180 | 0.00000 | 0.05033993 |
| 13 | $TiO_2$ | 2.34867 | 0.00037 | 0.04911753 |
| Substrate | Glass | 1.52092 | 0.00000 | |

Figure 4:
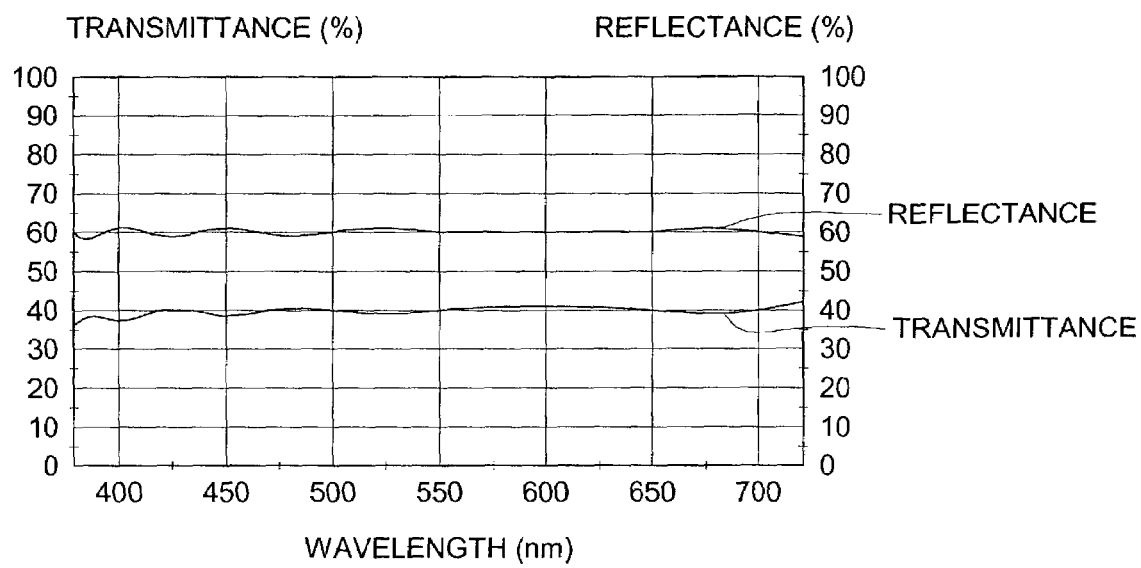
FIG. 4 is a graph showing an actually measured transmittance and reflectance of a dielectric half mirror film formed on a substrate.

A transmittance and a reflectance, actually measured of the dielectric half mirror film formed on a glass substrate according to a design of above-described Table 1, are shown by graphs in FIG. 4.

2. A design example in case of transmittance/reflectance=20/80 is shown in Table 2. It is comprised of total 14 layers of a low refractive index layer and a high refractive index layer in the order of layer numbers from 14 to 1 being accumulated on a glass substrate.

TABLE 2

| Layer number | Material | Refractive index | Extinction coefficient | Optical thickness |
|---|---|---|---|---|
| 1 | $TiO_2$ | 2.34867 | 0.00037 | 0.38748435 |
| 2 | $SiO_2$ | 1.46180 | 0.00000 | 0.33217658 |
| 3 | $TiO_2$ | 2.34867 | 0.00037 | 0.33713691 |
| 4 | $SiO_2$ | 1.46180 | 0.00000 | 0.29640595 |
| 5 | $TiO_2$ | 2.34867 | 0.00037 | 0.29905633 |
| 6 | $SiO_2$ | 1.46180 | 0.00000 | 0.31910406 |
| 7 | $TiO_2$ | 2.34867 | 0.00037 | 0.26218421 |
| 8 | $SiO_2$ | 1.46180 | 0.00000 | 0.23897652 |
| 9 | $TiO_2$ | 2.34867 | 0.00037 | 0.15501907 |
| 10 | $SiO_2$ | 1.46180 | 0.00000 | 0.21418007 |
| 11 | $TiO_2$ | 2.34867 | 0.00037 | 0.24266694 |
| 12 | $SiO_2$ | 1.46180 | 0.00000 | 0.25078465 |
| 13 | $TiO_2$ | 2.34867 | 0.00037 | 0.06588711 |
| 14 | $SiO_2$ | 1.46180 | 0.00000 | 0.27369652 |
| Substrate | Glass | 1.52092 | 0.00000 | |

Figure 5:
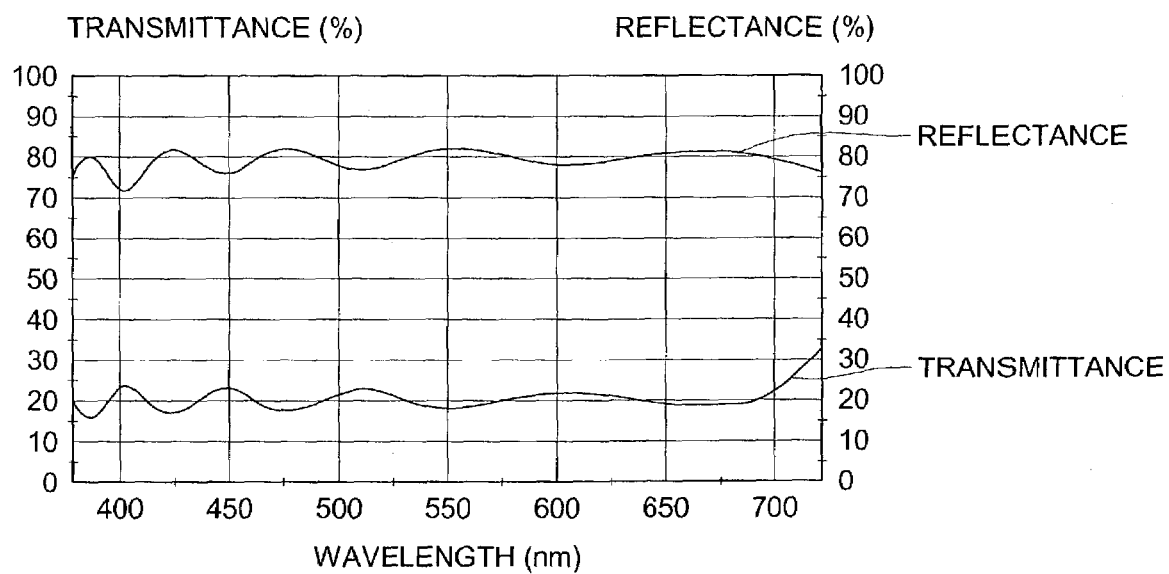
FIG. 5 is a graph showing an actually measured transmittance and reflectance of a dielectric half mirror film formed on a substrate.

A transmittance and a reflectance, actually measured of the dielectric half mirror film formed on a glass substrate according to a design of above-described Table 2, are shown by graphs in FIG. 5.

3. A design example in case of transmittance/reflectance=70/30 is shown in Table 3. It is comprised of total 5 layers of a low refractive index layer and a high refractive index layer in the order of layer numbers from 5 to 1 being accumulated on a glass substrate.

TABLE 3

| Layer number | Material | Refractive index | Extinction coefficient | Optical thickness |
|---|---|---|---|---|
| 1 | $TiO_2$ | 2.34867 | 0.00037 | 0.35294937 |
| 2 | $SiO_2$ | 1.46180 | 0.00000 | 0.22012418 |
| 3 | $TiO_2$ | 2.34867 | 0.00037 | 0.26249928 |
| 4 | $SiO_2$ | 1.46180 | 0.00000 | 0.08861230 |
| 5 | $TiO_2$ | 2.34867 | 0.00037 | 0.10091448 |
| Substrate | Glass | 1.52092 | 0.00000 | |

Figure 6:
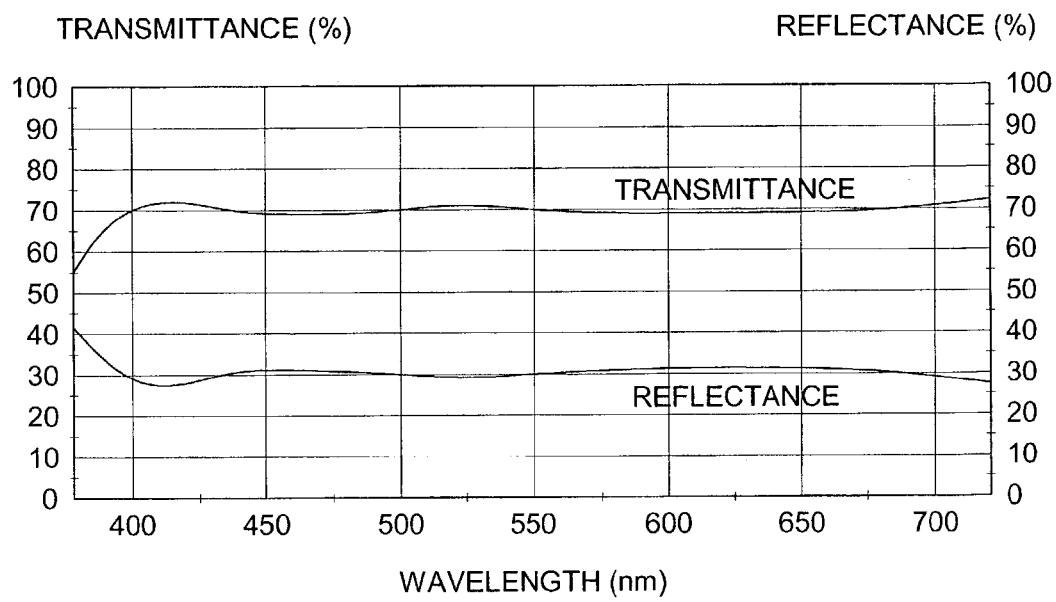
FIG. 6 is a graph showing an actually measured transmittance and reflectance of a dielectric half mirror film formed on a substrate.

A transmittance and a reflectance, actually measured of the dielectric half mirror film formed on a glass substrate according to a design of above-described Table 3, are shown by graphs in FIG. 6.

4. A design example, in case that transmittance and reflectance are not constant in a wavelength range of from 450 to 700 nm and vary greatly, is shown in Table 4. It is comprised of total 10 layers of a low refractive index layer and a high refractive index layer in the order of layer numbers from 10 to 1 being accumulated on a glass substrate.

TABLE 4

| Layer number | Material | Refractive index | Extinction coefficient | Optical thickness |
|---|---|---|---|---|
| 1 | $TiO_2$ | 2.34867 | 0.00037 | 0.29639717 |
| 2 | $SiO_2$ | 1.46180 | 0.00000 | 0.26298158 |
| 3 | $TiO_2$ | 2.34867 | 0.00037 | 0.27443390 |
| 4 | $SiO_2$ | 1.46180 | 0.00000 | 0.21066935 |
| 5 | $TiO_2$ | 2.34867 | 0.00037 | 0.56265880 |
| 6 | $SiO_2$ | 1.46180 | 0.00000 | 0.61285532 |
| 7 | $TiO_2$ | 2.34867 | 0.00037 | 0.49823492 |
| 8 | $SiO_2$ | 1.46180 | 0.00000 | 0.43447003 |
| 9 | $TiO_2$ | 2.34867 | 0.00037 | 0.26841990 |
| 10 | $SiO_2$ | 1.46180 | 0.00000 | 0.27132065 |
| Substrate | Glass | 1.52092 | 0.00000 | |

Figure 7:
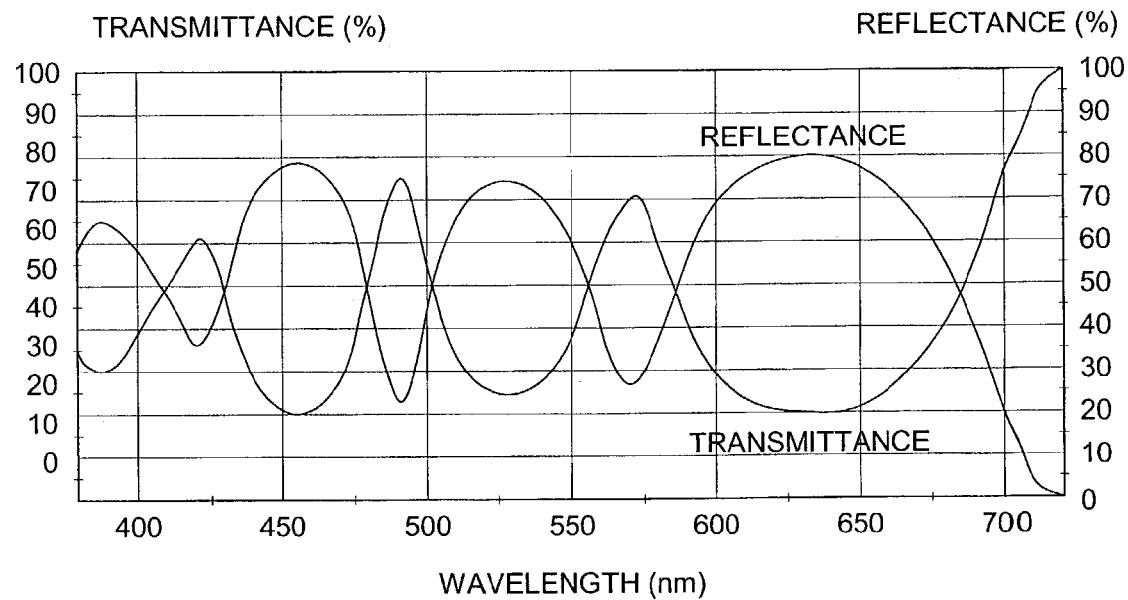
FIG. 7 is a graph showing an actually measured transmittance and reflectance of a dielectric half mirror film formed on a substrate.

A transmittance and a reflectance, actually measured of the dielectric half mirror film formed on a glass substrate according to a design of above-described Table 4, are shown by graphs in FIG. 7.

5. A design example in case of transmittance/reflectance=80/20 is shown in Table 5. It is comprised of total 4 layers of a low refractive index layer and a high refractive index layer in the order of layer numbers from 4 to 1 being accumulated on an acrylic resin substrate.

TABLE 5

| Layer number | Material | Refractive index | Extinction coefficient | Optical thickness |
|---|---|---|---|---|
| 1 | $AL_2O_3$ | 1.67716 | 0.00000 | 0.18333673 |
| 2 | $TaO_x$ | 2.05610 | 0.00000 | 0.37815194 |
| 3 | $SiO_2$ | 1.45920 | 0.00000 | 0.23405331 |
| 4 | $TaO_x$ | 2.05610 | 0.00000 | 0.22811036 |
| Substrate | Acrylic resin | 1.50408 | 0.00000 | |

Figure 8:
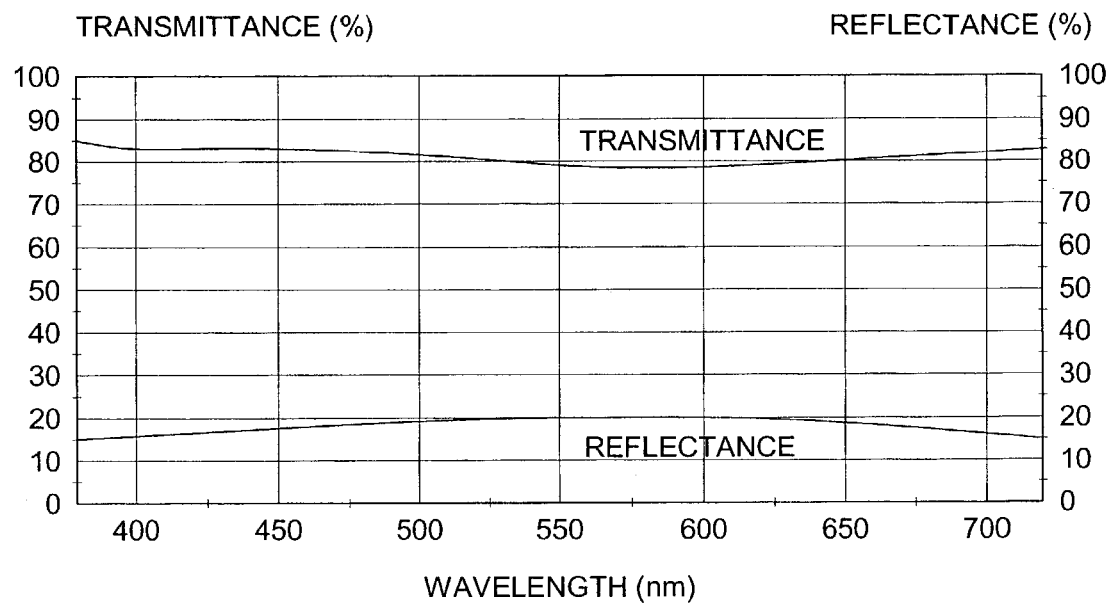
FIG. 8 is a graph showing an actually measured transmittance and reflectance of a dielectric half mirror film formed on a substrate.

A transmittance and a reflectance, actually measured of the dielectric half mirror film formed on a acrylic resin substrate according to a design of above-described Table 5, are shown by graphs in FIG. 8.

6. A design example in case of transmittance/reflectance=80/20 is shown in Table 6. It is comprised of total 3 layers of a low refractive index layer and a high refractive index layer in the order of layer numbers from 3 to 1 being accumulated on a glass substrate.

TABLE 6

| Layer number | Material | Refractive index | Extinction coefficient | Optical thickness |
|---|---|---|---|---|
| 1 | $SiO_2$ | 1.46180 | 0.00000 | 0.29361307 |
| 2 | $TiO_2$ | 2.34867 | 0.00037 | 0.24928239 |
| 3 | $SiO_2$ | 1.46180 | 0.00000 | 0.40594209 |
| Substrate | Glass | 1.52092 | 0.00000 | |

Figure 9:
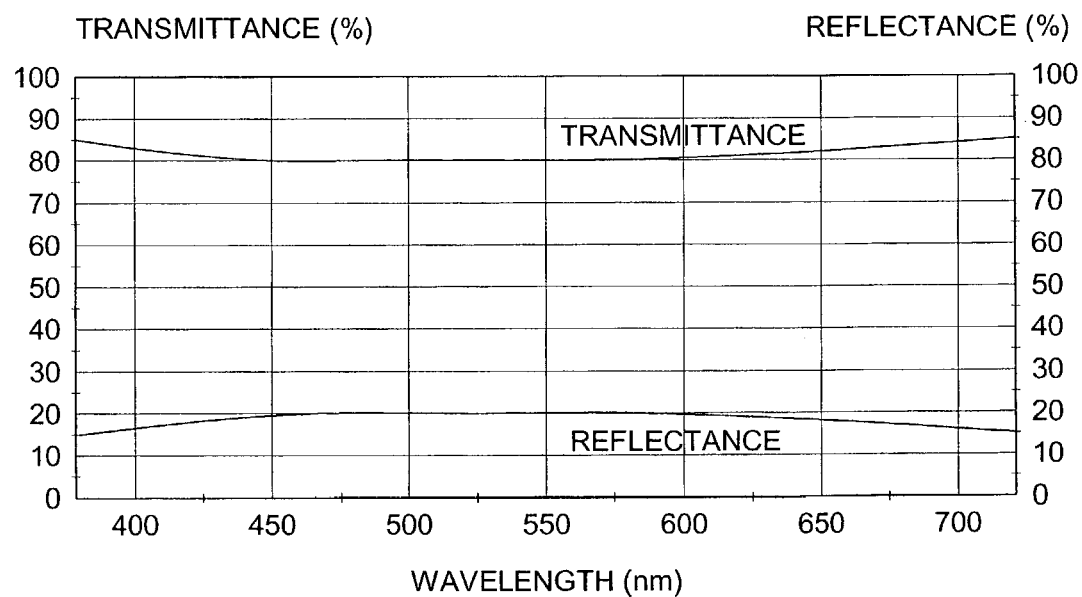
FIG. 9 is a graph showing an actually measured transmittance and reflectance of a dielectric half mirror film formed on a substrate.

A transmittance and a reflectance, actually measured of the dielectric half mirror film formed on a glass substrate according to a design of above-described Table 6, are shown by graphs in FIG. 9.

Herein, in Tables 1 to 6, each refractive index is a refractive index for a light of a wavelength of 510 nm; and an optical thickness is a value of n×d/510, wherein, n is a refractive index and d is an actual film thickness of each layer (unite is nm; a geometric thickness). Further, each accumulated layer constitution are represented by utilizing a glass substrate, however, since they are utilized in practice by providing a color filter layer, an adhesive layer or a protective layer, having a refractive index of from 1.5 to 1.6 on the surface of the outermost layer, the measurement of a reflectance and a transmittance were performed by light of wavelengths from 375 to 725 nm in a state of the outermost layer being in contact with a medium having a refractive index of approximately 1.52, and at an angle of incidence of 0 degree. Further, an actual film thickness (a geometric film thickness) can be determined, within an effective area, for example, by observing a cross-section of a film through an electron-microscope and averaging values of 5 points.

Further, in the above-described silicon oxide ($SiO_2$) and titanium oxide ($TiO_2$), improvement of a gas barrier property or adjustment of a refractive index can be realized by adding nitrogen at the time of deposition when necessary. In that case, they form an oxide nitride represented by compositions such as $SiO_xN_y$ and $TiO_xN_y$. Since a gas barrier property is enhanced while a transmittance is lowered when a ratio of nitrogen is increased, x and y are preferably a value satisfying the following equation when a transmittance is important:

$$0.4 \leq x/(x+y) \leq 0.8$$

A substrate having a transmittance capable of being utilized in the embodiment is not specifically limited provided that a half mirror film can be formed on the surface, including of a plate shape and of a steric shape such as of a lens shape. A thin film is formed by mounting a substrate between electrodes when a substrate can be mounted between electrodes, and by spraying generated plasma on the resin substrate when a substrate cannot be mounted between electrodes.

A material constituting a substrate is not specifically limited, and since the treatment is performed under atmospheric pressure or the vicinity thereof and by discharge at low temperatures, even a resin substrate does not suffer from being deteriorated.

As a substrate having a transmitting property, such as glass, quartz, resin and ceramic are preferably utilized and specifically preferably a resin material.

Further, a substrate on which an under-coat layer or other functional layer is coated, as well as a back-coat layer or an anti-static layer is coated, can be utilized as a substrate.

Materials of the above-described under-coat layer or a functional layer (being utilized also as a substrate) include, concretely, polyesters such as polyethylene terephthalate and polyethylene naphthalate; polyethylene; polypropylene; cellophane; cellulose esters such as cellulose diacetate, cellulose acetate butyrate, cellulose acetate propionate, cellulose acetate phthalate, cellulose triacetate and cellulose nitrate, and derivatives thereof; polyvinylidene chloride; polyvinyl alcohol; ethylene vinylalcohol; syndiotactic polystyrene; polycarbonate; a norbornene resin; polymethyl pentene; polyether ketone; polyimide; polyether sulfon: a polysulfon series; polyether ketone imide; polyamide; a fluorine-contained resin; nylon; acryl or acrylate series; etc.

A dielectric mirror film, or an alloy semi-transparent mirror film comprised of accumulated not less than two layers, as a half mirror film of the embodiment is formed by depositing each layer by a method in which a resin substrate having a transmitting property is exposed to a reactive gas brought into a plasma state by discharging between electrodes opposing each other under atmospheric pressure or the vicinity thereof (hereinafter, also may be referred to as an atmospheric pressure plasma method).

Next, a preferable embodiment of an atmospheric pressure plasma treatment method will be explained.

In case of a treatment is performed by apparatuses of FIGS. 1 and 2 or other apparatuses, the upper limit of a frequency of high frequency voltage applied between electrodes is preferably not more than 150 MHz. Further, the lower limit of a frequency of high frequency voltage is over 100 kHz, preferably not less than 200 kHz and more preferably not less than 800 kHz.

Further, the lower limit of electric power applied between electrodes is not less than $1.0 \text{ W/cm}^2$ and preferably not less than $1.2 \text{ W/cm}^2$, and the upper limit is preferably not more than $50 \text{ W/cm}^2$ and preferably not more than $20 \text{ W/cm}^2$. Herein, a voltage application area in an electrode ($/\text{cm}^2$) indicates an area where discharge is caused.

Further, high frequency voltage applied between electrodes may be intermittent pulse waves or continuous sine waves, however, it is preferably continuous sine waves to obtain effects of the invention sufficiently.

As such an electrode, a metal mother material covered with a dielectric is preferable. At least either one of an applying electrode and an earth electrode opposing each other is coated with a dielectric, and it is further preferable to coat both of an applying electrode and an earth electrode opposing each other. A dielectric is preferably an inorganic substance having a specific dielectric constant of from 6 to 45, and such a dielectric includes ceramics such as alumina and silicon nitride, or a glass lining material such as silicate type glass and borate type glass.

Further, in case of exposing a substrate by being mounted or transported between electrodes, it is possible to maintain a thickness of a dielectric and a gap between electrodes constant, to stabilize a discharging state, to eliminate distortions and cracks due to thermal shrinkage and residual stress, as well as to improve durability significantly by covering with a non-porous inorganic dielectric of high precision.

Further, in a production of an electrode by dielectric coating on a metal mother material at high temperatures, it is necessary to finish by polishing at least the side of a dielectric in contact with a substrate, and to minimize a difference between thermal expansions of a mother material of an electrode and of a dielectric as much as possible; for that purpose, in a production method, it is preferable to provide a lining on the mother material surface with an inorganic material under a control of a foam mixing amount as a stress absorbing layer, and specifically to utilize a glass obtained by means of a fusing method well known in such as porcelain as a material, and, further, an excellent electrode having minuteness and free of crack generation can be prepared by setting a foam mixing amount in the undermost layer at from 20 to 30 volume % and that of the following layers after that at not more than 5 volume %.

Further, another method to cover a mother material of an electrode with a dielectric is to perform sputtering of ceramic to not more than 10 volume % of a vacancy ratio and to being subjected to a sealing treatment by an inorganic substance which cures by a sol-gel reaction; wherein, thermal curing or UV curing is preferable to accelerate a sol-gel reaction, and inorganization is improved to obtain an minute electrode without deterioration by further diluting a sealing solution and by repeating coating and curing several times successively.

A value of voltage applied to electrodes is suitably determined by adjusting, for example, a voltage to approximately from 0.5 to 10 kV and a frequency of a power source to over 100 kHz and not more than 150 MHz. Further, an electric power of not less than 1 W/cm$^2$ is preferably applied between electrodes to generate discharge between them. Herein, with respect to application method of a power source, either of a continuous emission mode called as a continuous mode of a state of continuous sine waves or an intermittent emission mode called as a pulse mode in which ON/OFF is intermittently performed can be adopted, however, a continuous mode can provide a film having more minuteness and excellent quality.

Further, to minimize the effects on a substrate at the time of a treatment in a plasma state, a temperature of a substrate at the time of a treatment in a plasma state is preferably adjusted to from ordinary temperature (from 15 to 25° C.) to 200° C. and furthermore preferably adjusted to from ordinary temperature to 100° C. To adjust temperature to the above-described range, a treatment in a plasma state is performed while an electrode and a substrate being cooled by a cooling means, when necessary.

Figure 14:
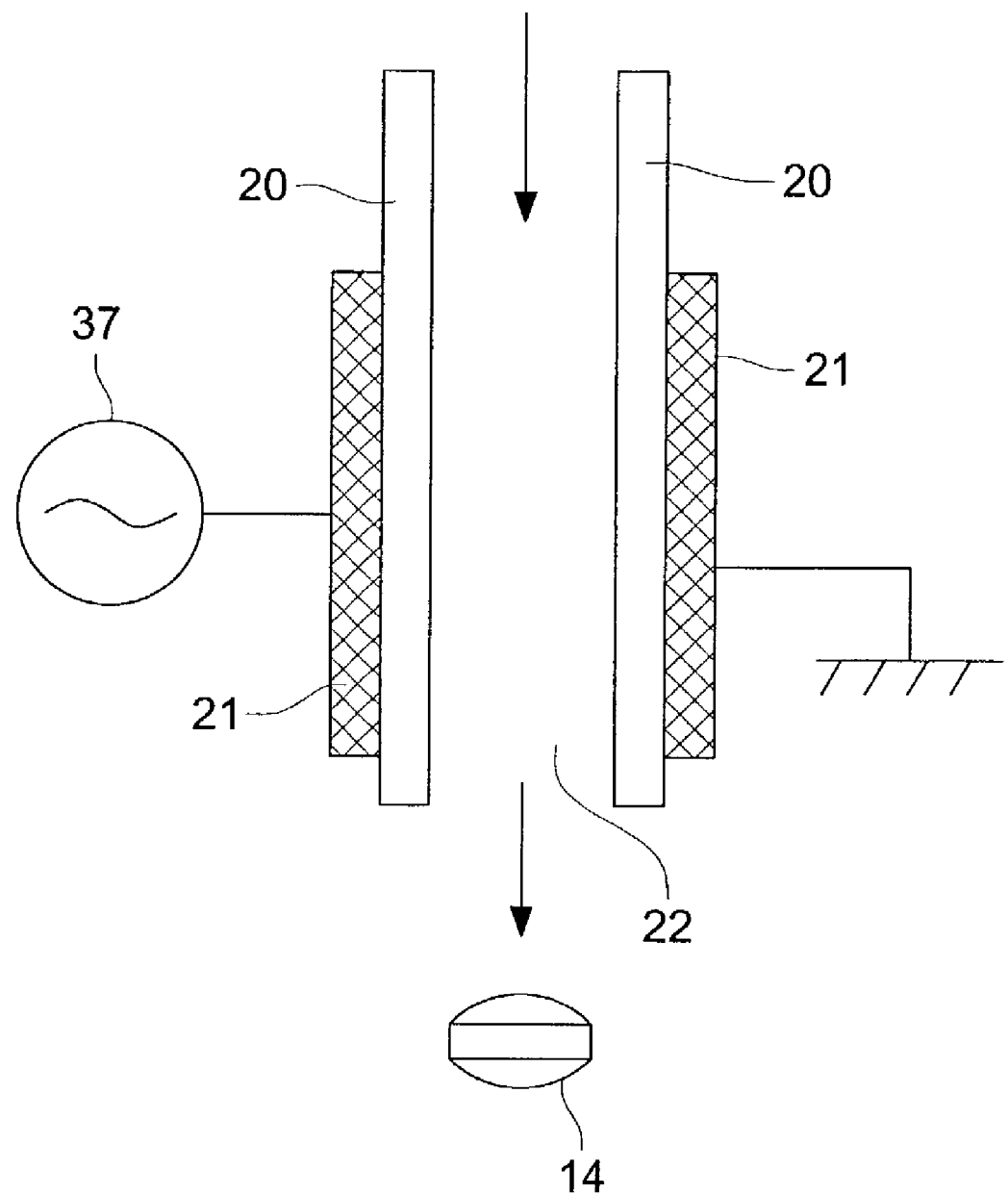
FIG. 14 is a brief constitutional drawing of another plasma discharge treatment apparatus, which can perform an atmospheric plasma treatment.

FIG. 14 is a brief constitutional drawing of a plasma discharge treatment apparatus capable of performing an atmospheric pressure plasma method. In FIG. 14, a gas mixture of an inert gas and a reactive gas is introduced from the upper portion of the drawing into discharge apace 22 of a slit-shape being comprised of metal mother material 20 coated with dielectric 21, the reactive gas being converted into a plasma state by applying a high frequency voltage by use of power source 37, and the reactive gas in a plasma state is spurted on material 14 of an optical part to form a coating film on the surface.

Figure 15:
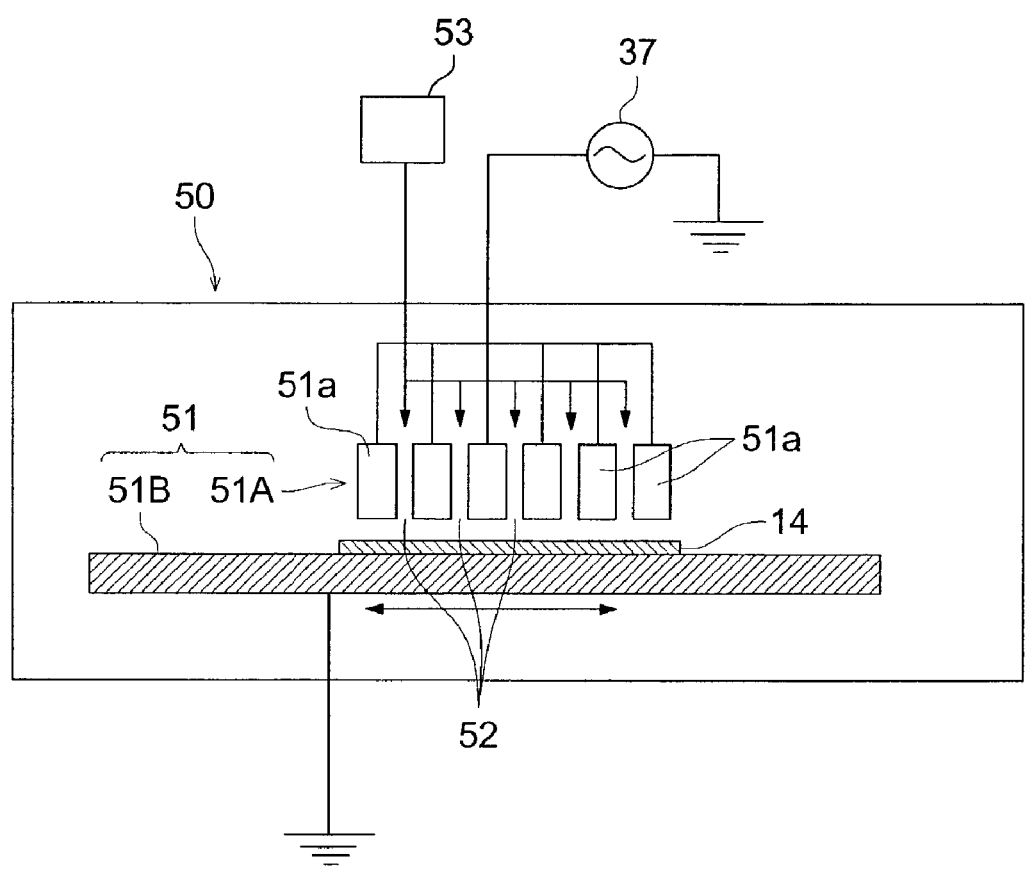
FIG. 15 is a brief constitutional drawing of another plasma discharge treatment apparatus capable of performing an atmospheric plasma method being preferable in case that a substrate is thin to some extent (for example, not more than 5 mm).

FIG. 15 is a brief constitutional drawing of another plasma discharge treatment apparatus capable of performing an atmospheric pressure plasma method, which is specifically preferable when a substrate is thin to some extent (for example not more than 5 mm). Plasma discharge treatment apparatus 50 of a parallel flat plate type as shown in FIG. 15 can be applied to a substrate capable of being bent. More concretely, plasma discharge treatment apparatus 50 will be explained.

Plasma discharge treatment apparatus 50 is constituted of such as power source 37 and electrode 51, and electrode 51 has upper plate electrode 51A and lower plate electrode 51B. Upper plate electrode 51A and lower plate electrode 51B are arranged up and down opposing to each other.

Upper plate electrode 51A is comprised of plural number of nearly rectangular plate electrodes 51a, - - - being arranged neighboring with each other in the lateral direction, and each space between neighboring plate electrodes 51a and 51a constitutes gas flow passage 52. Gas supplying portion 53 is provided upward of upper plate electrode 51A, and a reactive gas and an inert gas are supplied from gas supplying portion 53 into each gas flow passage portion 52 to be spurted to the space between upper plate electrode 51A and under plate electrode 51B.

Lower plate electrode 51B, on the surface of which substrate 14 being mounted, is grounded to an earth, and is designed to be movable back and forth against gas flow passage 52 in a crossing direction. Therefore, a plasma state is generated between upper plate electrode 51A and lower plate electrode 51B by movement of under plate electrode 51B to form a film on substrate 14. By such movement of a substrate 14, deposition can be performed even for a substrate having an area larger than a discharge area.

In the invention, the above-described treatment in a plasma state is performed under atmospheric pressure or the vicinity thereof, wherein the vicinity thereof represents a pressure of from 20 to 110 kPa, however, it is preferably from 93 kPa to 104 kPa to suitably obtain the effects described in the invention.

In a discharge electrode, it is preferable to adjust the maximum height of a surface roughness defined by JIS B 0601 at least on the side of contacting with a substrate to not more than 10 μm, furthermore preferably not more than 8 μm and specifically preferably not more than 7 μm, in respect to obtaining effects described in the invention. Further, a mean center-line surface roughness (Ra) defined in JIS B 0601 is preferably not more than 0.5 μm and furthermore preferably not more than 0.1 μm.

Next, a gas mixture according to a deposition method by the atmospheric pressure plasma method will be explained. A gas utilized differs depending on a kind of a half mirror film to be formed on a substrate, however, basically comprised of a gas mixture of an inert gas, and a reactive gas for film formation. A reactive gas is preferably contained at from 0.01 to 10 volume % based on a gas mixture. A thickness of a thin film obtained is from 0.1 to 1000 nm.

The above-described inert gas includes elements in the 18th group of the periodic table, concretely helium, neon, argon, krypton, xenon and radon, and helium and argon are preferably utilized to obtain effects described in the embodiment.

The followings can be utilized as a reactive gas. In case of an alloy semi-transparent film (for example, being utilized as a half mirror film), organometallic compounds containing Au, Ag, Cu, Pt, Ni, Pd, Se, Te, Rh, Ir, Ge, Os, Ru, Cr, W, In, Sn or Zn can be utilized. At that time, a reaction system is under reducing environment. Further, in case of a dielectric film in which layers having different refractive indexes are accumulated, the film can be formed by utilizing, for example, a reactive gas containing an organofluoride compound, a silicon compound (a low refractive index layer) or a titanium compound (a high refractive index layer).

As an organofluoride compound, such as a carbon fluoride gas and a hydrocarbon fluoride gas are preferably utilized. A carbon fluoride gas includes carbon tetrafluorides and carbon hexafluorides, concretely, such as tetrafluoromethane, tetrafluoroethylene, hexafluoropropyrene and octafluorocyclobutane. Further, a hydrocarbon fuluoride includes such as difuluoromethane, tetrafluoroethane, tetrafluoropropyrene and trifluoropropyrene.

Further, halogenides of hydrocarbon fluorides such as monochlorotrifluoromethane, monochlorodifluoromethane and dichlorotetrafluorocyclobutane, and fluorine substituents of organic compounds such as alcohols, acids and ketones can be utilized, however, the invention is not limited thereto. Further, these compounds may have an ethylenically unsaturated group in a molecule, and they may be utilized alone or in combinations.

In case of utilizing the above-described organofluoride compounds in a gas mixture, a content of an organofluoride compound in a gas mixture is preferably from 0.1 to 10 volume % and furthermore preferably 0.1 to 5 volume %, in respect to forming a uniform thin film on a substrate by a treatment in a plasma state.

Further, in case of an organofluoride compound according to the embodiment being a gas under ordinary temperature and pressure, a method of the invention can be most easily performed because it can be utilized as a constituent component as it is. However, in case of an organofluoride compound according to the invention being a liquid or a solid under ordinary temperature and pressure, it may be utilized by being vaporized by means of heating or reduced pressure, or by being dissolved in a suitable solvent.

In case of utilizing the above-described titanium compound in a gas mixture, a content of a titanium compound in a gas mixture is preferably from 0.01 to 10 volume % and more preferably from 0.01 to 5 volume %, in respect to forming a uniform thin film on a substrate by a treatment in a plasma state.

Further, hardness of a thin film can be significantly improved by containing from 0.1 to 10 volume % of hydrogen gas in the above-described gas mixture.

Further, a reaction can be accelerated as well as a thin film having minuteness and excellent quality can be formed, by containing from 0.01 to 5 volume % of a component selected from oxygen, ozone, hydrogen peroxide, carbon dioxide, carbon monoxide, hydrogen and nitrogen, in a gas mixture.

As the above-described silicon compound and titanium compound, a metal hydride compound and a metal alkoxide compound are preferable in respect to handling, and a metal alkoxide is preferably utilized because of no generation of a corrosive and harmful gas and minimal contamination in a manufacturing process.

Further, to introduce the above-described silicon compound or titanium compound between electrodes as a discharge space, both may be any state of a gas, a liquid and a solid under ordinary temperature and pressure. In case of a gas, it can be introduced as it is, however, in case of a liquid or solid, it can be utilized by being vaporized by means of such as heating, reduced pressure and ultrasonic irradiation. When a silicon compound or a titanium compound is utilized by being vaporized by means of heating, metal alkoxides, which are liquids under ordinary temperature and have a boiling point of not higher than 200° C., such as tetraethoxy silane and tetraisopropoxy titanium can be preferably utilized. The above-described metal alkoxides may be utilized by being diluted by use of solvents, and organic solvents such as methanol, ethanol and n-hexane and mixed solvents thereof can be utilized as the solvent. Herein, the effects of these diluting solvents on such as formation of a thin film on a substrate and a composition of a thin film can be almost neglected, because the solvents are decomposed into molecules or atoms during a plasma discharge treatment.

As the above-described silicon compounds, for example, organometallic compounds such as dimethyl silane and tetramethyl silane; metal hydride compounds such as monsilane and disilane; metal halogenide compounds such as dichloro silane and trichloro silane: alkoxy silanes such as tetramethoxy silane, tetraethoxy silane and dimethyldiethoxy silane; and organosilanes can be utilized, however, the invention is not limited thereto. They can be also utilized in suitable combinations.

In case of utilizing the above-described silicon compounds in a gas mixture, a content of a silicon compound in a gas mixture is preferably from 0.1 to 10 volume % and further preferably from 0.1 to 5 volume %, in respect to forming a uniform thin film on a substrate by a treatment in a plasma state.

As the above-described titanium compound, organometallic compounds such as tetradimethylamino titanium, metal hydride compounds such as monotitane and dititane, metal halogenide compounds such as dichloro titanium, trichloro titanium and tetrachloro titanium, metal alkoxides such as tetraethoxy titanium, tetraisopropoxy titanium and tetrabutoxy titanium are preferably utilized, however, the invention is not limited thereto.

Further, as the above-described tantalum compound, organometallic compounds such as tetradimethylamino tantalum, metal hydride compounds such as monotantalume and ditantatlume, metal halogenide compounds such as dichloro tantalum, trichloro tantalum and tetrachloro tantalum, metal alkoxides such as tetraethoxy tantalum, tetraisopropoxy tantalum and tetrabutoxy tantalum are preferably utilized, however, the invention is not limited thereto.

Further, as the above-described aluminum compound, organometallic compounds such as tetradimethylamino aluminum, metal hydride compounds such as monoaluminume and dialuminume, metal halogenide compounds such as dichloro aluminum, trichloro aluminum and tetrachloro aluminum, metal alkoxides such as tetraethoxy aluminum, tetraisopropoxy aluminum and tetrabutoxy aluminum are preferably utilized, however, the invention is not limited thereto.

In case of adding an organometallic compound in a reactive gas, for example, the organometallic compound can contains a metal selected from Li, Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb and Lu. The organometallic compounds are more preferably selected from metal alkoxides, alkyl metals and metal complexes.

In the embodiment, a dielectric film is preferably comprised of a high refractive index layer, of which a main component is titanium oxide having a refractive index of from 1.85 to 2.60, and a low refractive index layer, of which a main component is silicon oxide having a refractive index of from 1.30 to 1.57, deposited in succession on the surface of a resin substrate or a glass substrate. To provide immediately a high refractive index layer and a low refractive index layer by a treatment in a plasma state, can enhance adhesion between a film and a resin substrate and decrease crack generation. Further, it is specifically preferable to utilize titanium oxide as a main component and to set a refractive index to not less than 2.2 in a high refractive index layer.

In the embodiment, a dielectric film preferably has a carbon content of both a high refractive index layer and a low refractive index layer of from 0.2 to 5 weight %, in respect to adhesion of a film with an underlying layer and flexibility of a film (prevention of cracks). The carbon content is more preferably from 0.3 to 3 weight %. That is, since a layer formed by a treatment in a plasma state contains an organic substance (a carbon atom), it is preferable that the range provides a film with flexibility to achieve an excellent adhesion property of a film. There is a tendency to cause variation of a refractive index during storage, when a carbon content ratio is too large, which is not preferred.

Next, concrete examples will be explained in reference to comparative examples.

COMPARATIVE EXAMPLE 1

Figure 10:
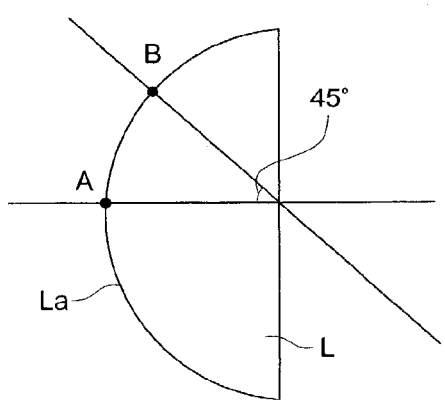
FIG. 10 is a cross sectional drawing of a lens proposed to an experiment by the inventors.
Figure 11:
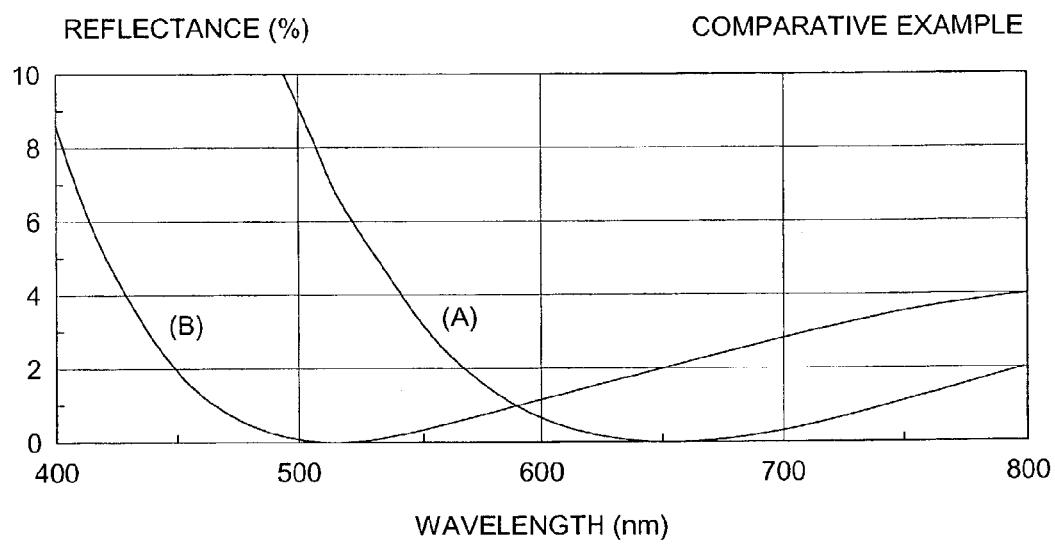
FIG. 11 is a drawing showing spectroscopic characteristics of lens L at a vertex and at B point where the perpendicular direction of the plane makes 45° with an optical axis.

Firstly, as a comparative example, an anti-reflection film was coated on optical plane La of half-spherical lens L, of which a cross section being shown in FIG. 10, having a large angle of incident light by means of vacuum evaporation under conditions shown in Table 7. Spectral characteristics at vertex A and at B point where a degree of a vertical direction of the plane with an optical axis is 45° are shown in FIG. 11.

TABLE 7

|  | Film material | Optical thickness |
|---|---|---|
| Second layer | SiO$_2$ | 0.322 $\lambda_0$ |
| First layer | TiO$_2$ | 0.080 $\lambda_0$ |
| Lens | Amorphous polyolefin type resin |  |

Design wavelength: $\lambda_0$ = 650 nm

At vertex A, an anti-reflection film shows a minimum reflectance at a wavelength of 650 nm, while at B point a reflectance at a wavelength of 650 nm is increased because a film thickness becomes thinner to shift a wavelength of the minimum reflectance to a shorter wavelength side.

EXAMPLE 1

Figure 12:
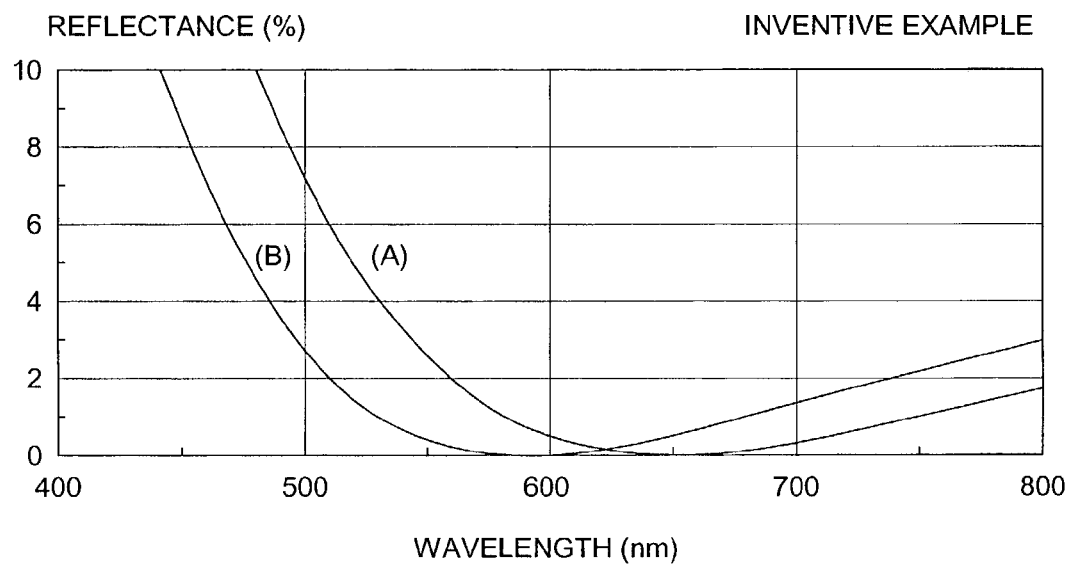
FIG. 12 is a drawing showing spectroscopic characteristics of lens L at a vertex and at B point where the perpendicular direction of the plane makes 45° with an optical axis.

In a similar manner to comparative example 1, lens L as a substrate being made of a resin, utilizing an amorphous polyolefin resin (Zeonex, manufactured by Nippon Zeon Co., Ltd.), the first layer comprised of titanium oxide as a main component and the second layer comprised of silicon oxide as a main component thereon were formed in the order on optical plane La which was a curved plane to form an anti-reflection film comprised of two layers. In this case, an anti-reflection film was coated on optical plane La by an atmospheric pressure plasma method. The film thickness was set to the same as those in comparative example 1. The deposition conditions of an atmospheric pressure plasma method are shown in Table 8. Similar to comparative example 1, the results in which spectroscopic characteristics were measured at two points of vertex A and B point in the neighborhood are shown in FIG. 12. According to FIG. 12, the wavelengths of minimum reflectance are close each other, to prove that a uniform film is formed on optical plane La of lens L. Therefore, compared to a vacuum evaporation method, it has been proved that a difference of reflectance between at a center portion and at a surrounding portion can be minimized in an atmospheric pressure plasma method. Further, an anti-reflection film obtained was minute and high in hardness as well as extremely excellent in adhesion with a substrate.

TABLE 8

| Film material | Reactive gas | Inert gas | Inert gas | RF frequency | RF output power (electric power) |
|---|---|---|---|---|---|
| SiO$_2$ | TEOS | O$_2$ | He | 13.56 MHz | 2 W/cm$^2$ |
| TiO$_2$ | TTIP | O$_2$ | He | 13.56 MHz | 5 W/cm$^2$ |

TEOS: tetramethoxy silane
TTIP: titanium tetraisopropoxy

In the above examples, one piece of lens was explained, however, significant effects can be expected in achieving uniform film thickness and optical characteristics over a whole element with such as a micro-lens sheet in which curved planes are aligned discontinuously.

COMPARATIVE EXAMPLE 2

Figure 13:
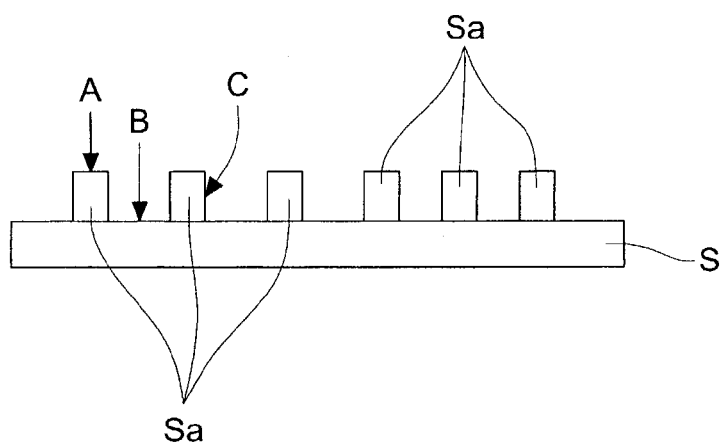
FIG. 13 is a cross sectional drawing of a light guide plate proposed to an experiment by the inventors.

FIG. 13 shows a cross section of a light guide plate utilized in another experiment performed by the inventors. On the upper portion of light guide plate S, rectangular shaped convex portions Sa, which are aligned at same intervals and in parallel to each other, are formed. Herein, an anti-reflection film comprised of four layers was formed by a sputtering method. The design values are shown in Table 9.

TABLE 9

|  | Film material | Optical thickness (nm) |
|---|---|---|
| Fourth layer | SiO$_2$ | 0.249 $\lambda_0$ |
| Third layer | TiO$_2$ | 0.515 $\lambda_0$ |
| Second layer | SiO$_2$ | 0.092 $\lambda_0$ |
| First layer | TiO$_2$ | 0.060 $\lambda_0$ |
| Light guide plate | Amorphous polyolefin type resin |  |

Design wavelength: $\lambda_0$ = 650 nm

When a cross sectional shape was observed through an electronmicroscope after coating, ununiformity with respect to film thickness, at point A on a convex portion Sa, adjacent convex portion Sa, center point B between Sa, and point C in the side surface of convex portion Sa, was observed as shown in Table 10, and an anti-reflection capability estimated by the design values could not be expected.

TABLE 10

| Measurement point | Relative film thickness |
|---|---|
| A | 1 |
| B | 0.65 |
| C | 0.40 |

EXAMPLE 2

In a similar manner to comparative example 2, light guide plate S as a substrate being made of a resin, utilizing an amorphous polyolefin resin (Arton, manufactured by JSR Co., Ltd.), an anti-reflection film was formed on a plane having a regular rough pattern. In this case, an anti-reflection film was coated by an atmospheric pressure plasma method (utilizing plasma discharge treatment apparatus 50 shown in FIG. 15) different from comparative example 2. Based on the design values of Table 11, a film was formed under the same deposition conditions as example 1. Similar to comparative example 2, film thickness at three points was observed to give results as shown in Table 12. Further, an anti-reflection film obtained was minute and high in hardness as well as extremely excellent in adhesion with a substrate.

TABLE 11

|  | Film material | Optical thickness (nm) |
|---|---|---|
| Fourth layer | SiO$_2$ | 0.247 $\lambda_0$ |
| Third layer | TiO$_2$ | 0.517 $\lambda_0$ |
| Second layer | SiO$_2$ | 0.093 $\lambda_0$ |
| First layer | TiO$_2$ | 0.059 $\lambda_0$ |
| Light guide plate | Amorphous polyolefin type resin |  |

Design wavelength: $\lambda_0$ = 650 nm

TABLE 12

| Measurement point | Relative film thickness |
|---|---|
| A | 1 |
| B | 0.9 |
| C | 0.75 |

It is clear from Tables 10 and 12, that in example 2, a film thickness distribution becomes significantly more uniform compared to comparative example 2. By deposition on an element having a patterned shape by use of an atmospheric pressure plasma method, significant effects can be expected in respect to achieving uniform film thickness and stable optical characteristics over a whole element.

Next, a shape of a base material to which a surface treating method of the present invention can be preferably applied, is described.

Figure 16:
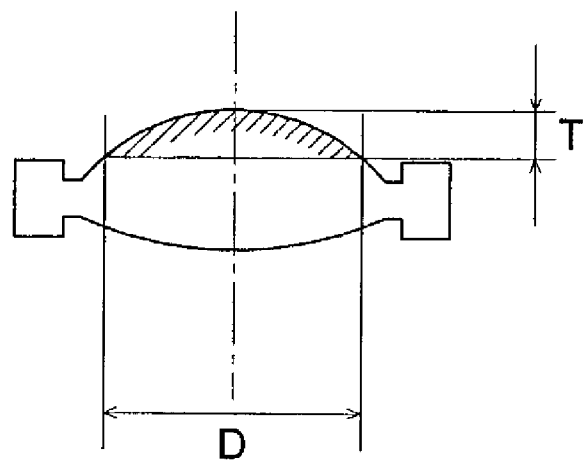
FIG. 16(a) is a cross sectional drawing of a lens.
FIG. 16(b) is a cross sectional drawing of a lens array.
Figure 16:
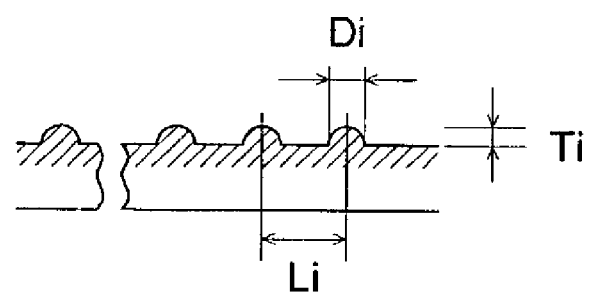

In case of a single body lens having an optical surface such as a spherical surface or an aspherical surface, as the base material having a curved surface, when the following formulas are satisfied, the effect of the surface treating method of the present invention is further exercised.

$$0 < D \leq 300$$

$$0 < T/D \leq 1.0$$

where a diameter of an effective optical surface is D (mm), and a thickness of the effective optical surface on the optical axis is T, as shown in FIG. 16(a).

Especially, when the lens is a lens for use in an optical pickup apparatus, it may be preferable to satisfy the following formulas.

$$0 \leq D \leq 10$$

$$0.2 \leq T/D \leq 0.5$$

With the surface treating method of the present invention, a very thin layer having a high uniformity can be formed on the effective optical surface of the lens. Further, when plural lenses are placed on the plane, the plural lenses can be subjected to the surface treatment simultaneously. When a reflection preventing layer is formed, it is possible to form uniformly a good reflection preventing layer on the entire effective optical surface. Also, when a hard coat layer is formed, it is possible to form uniformly a hard coat layer having a high abrasion resistance on the entire effective optical surface.

Figure 19:
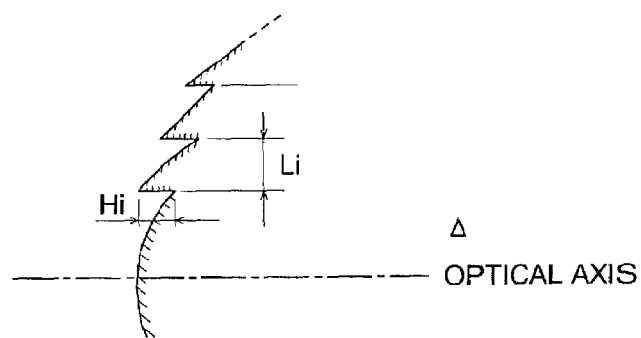
FIG. 19 is a cross sectional drawing showing a diffractive lens.

Further, when a plurality of concentric ring-shaped step portions such as a plurality of concentric ring-shaped diffractive zones are provided on the optical surface, the effect of the present invention is further exercised. In this case, it may be preferable to satisfy the following formula.

$$0 < Hi \leq 0.01$$

$$0.001 \leq Li \leq 0.1$$

where Hi is a depth (mm) of the plural ring-shaped step portions and Li is an interval (mm) of the plural ring-shaped step portions as shown in FIG. 19.

With the surface treating method of the present invention, a reflection preventing layer can be formed on plurality of concentric ring-shaped diffractive zones. In particular, the shape of the step portions is a saw tooth shape, the effect of the surface treating method of the present invention is further exercised more.

FIG. 16(b) shows a construction in which lens sections having the optical surface such as the spherical surface or the spherical surface are arrayed on a plane. When the following formulas are satisfied, where the diameter of the lens section is Di (mm), a thickness of the lens section is Ti (mm), and an array pitch is Li, the effect of the present invention is further exercised.

$$0 < Di \leq 300$$

$$0 < Ti/Di \leq 1.0$$

$$0 < Li \leq 200$$

In this case, Di, Ti, and Li are not limited to a single type, but a plurality of types of the shapes can exist together on the base board.

Especially, when the lens array is a micro lens array, it may be preferable to satisfy the following formula:

$$0.01 \leq Di \leq 2$$

$$0.2 < Ti/Di \leq 0.5$$

$$0.01 \leq Li \leq 5$$

With the surface treating method of the present invention, a very thin layer having a high uniformity can be formed on the effective optical surface of each micro lens.

In case of providing an uneven shape on a flat or curved surface of the base materials of the optical parts, such as a light introducing plate, a wave introducing base plate, a polarization filter, a phase filter, an optical filter, and a diffraction grating, the surface treating method of the present invention can be applied preferably.

Figure 17:
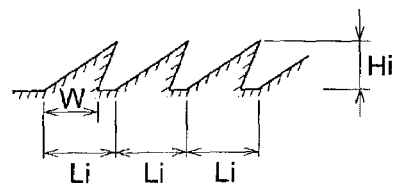
FIGS. 17(a) and 17(b) is a cross sectional drawing of an optical plate.
FIG. 17(c) is a cross sectional drawing of a prism.
Figure 17:
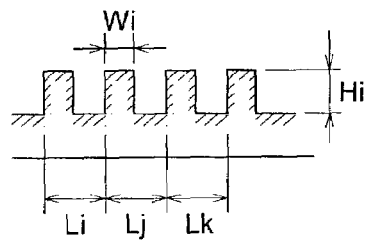
Figure 17:
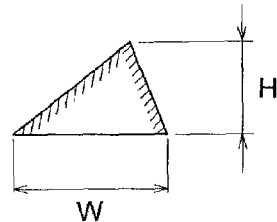

In case of a saw-shape as shown in FIG. 17(a), or a rectangle shape as shown in FIG. 17(b), when the following formulas are satisfied, where a height is Hi (mm), a width is Wi (mm), and a pitch is Li (mm), the effect of the present invention is further exercised.

$$0 < Li \leq 30$$

$$0 < Hi/Li \leq 3.0$$

where, Hi, Wi, and Li are not limited to a single type, but several different types of shapes (Lk) can be provided together on the base board. In this case, for example, as shown in FIG. 17(b), it is preferable to satisfy the following formula.

$$0 < Wi < Li, Lk$$

Especially, when the base board is a light introducing plate, it may be preferable to satisfy the following formula:

$$0.05 \leq Li \leq 2$$

$$0.01 \leq Hi/Li \leq 0.1$$

With the surface treating method of the present invention, when a reflection preventing layer or a half mirror layer is formed, it is possible to form these layer uniformly on the entire effective optical surface. In particular, when the light introducing plate is used as a light introducing plate for a back side light source for a liquid crystal display element, it is possible to obtain a good display element having less luminance irregularity.

In case of a prism form as shown in FIG. 17(c), where a height is H (mm), and a width is W (mm), when the following formulas can be satisfied, the effect of the present invention can be applied further.

$$0 < W \leq 30$$

$$0 < H/W \leq 3.0$$

Especially, when the prism is a micro prism, it may be preferable to satisfy the following formulas.

$$0.5 \leq W \leq 4.0$$

$$0.5 \leq H \leq 4.0$$

Figure 18:
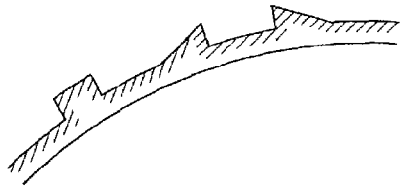
FIG. 18 is a cross sectional drawing showing an example of an optical element on which a uneven surface is provided on a curved surface.

As same with the light introducing plate, with the surface treating method of the present invention, when a reflection preventing layer, a half mirror layer, or a wavelength separating layer such as a dichroic layer is formed, it is possible to form these layer uniformly on the entire effective optical surface. Further, when plural micro prisms are placed on the plane, the plural micro prisms can be subjected to the surface treatment simultaneously. FIG. 18 shows an example wherein the uneven shape are arranged on the optical surface such as the spherical surface or the aspherical surface.

In what described above, the invention has been explained in reference to embodiments, however, the invention should not be understood being limited to the above-described embodiments and they are naturally possible to be suitably modified or improved.

The invention is able to provide a surface treatment method which can deposit a more uniform film regardless a surface shape to be treated, and an optical part to be deposited thereby; further a surface treatment method which can deposit a more uniform film even when a surface to be treated being fixed, and an optical part to be deposited thereby; and further also even under atmospheric pressure, to provide a surface treatment method which can deposit a more uniform film, and an optical part to be deposited thereby.

What is claimed is:

1. A surface treating method of forming a coating layer on a base material, comprising:
   conducting a plasma processing under an atmospheric pressure for the base material so as to form a coating layer on the base material having at least one of a curved surface and an uneven surface, wherein the base material is a lens having an effective optical surface and the lens satisfies the following formulas:

$$0 < D \leq 300$$

$$0 < T/D \leq 1.0$$

where D is a diameter (mm) of the effective optical surface and T is a thickness (mm) of the effective optical surface on an optical axis.

2. The surface treating method of claim 1, wherein the lens is a lens for use in an optical pickup apparatus and the lens satisfies the following formulas:

$$1 \leq D \leq 10$$

$$0.23 T/D \leq 0.5.$$

3. The surface treating method of claim 1, wherein plural ring-shaped step portions are provided on the effective optical surface and satisfy the following formula.

$$0 < Hi \leq 0.01$$

$$0.001 \leq Li \leq 0.1$$

where $Hi$ is a depth (mm) of the plural ring-shaped step portions and $Li$ is an interval (mm) of the plural ring-shaped step portions.

4. The surface treating method of claim 1, wherein the base material is a lens array on which plural lens sections are mounted in a form of an array and satisfies the following formulas:

$$0 < Di \leq 300$$

$$0 < Ti/Di \leq 1.0$$

$$0 < Li \leq 200$$

where $Di$ is a diameter (mm) of a lens section, $Ti$ is a thickness (mm) of the lens section and $Li$ is an interval (mm) of the plural lens sections.

5. The surface treating method of claim 4, wherein the lens array is a micro lens array and satisfies the following formulas:

$$0.01 \leq Di \leq 2$$

$$0.2 \leq Ti/Di \leq 0.5$$

$$0.01 \leq Li \leq 5.$$

6. The surface treating method of claim 1, wherein at least one of a concave or a convex is provided on the uneven surface of the base material.

7. The surface treating method of claim 6, wherein plural convexes being shaped in one of a saw tooth and a rectangle are provided on the base material with an arrangement satisfying the following formulas:

$$0 < Li \leq 30$$

$$0 < Hi/Li \leq 3.0$$

$$0 < Wi < Li$$

where $Hi$ is a height (mm) of the convex, $Wi$ is a width (mm) of the convex and $Li$ is an interval (mm) of plural convexes.

8. The surface treating method of claim 7, wherein some of the plural convexes are provided on the base material with a different interval $Lk$ (mm) and satisfies the following formula:

$$0 < Wi < Lk.$$

9. The surface treating method of claim 7, wherein the base material is a light introducing plate satisfying the following formulas:

$$0.05 \leq Li \leq 2$$

$$0.01 \leq Hi/Li \leq 0.1.$$

10. The surface treating method of claim 1, wherein the base material is a prism satisfying the following formulas:

$$0 < W \leq 30$$

$$0 < HW \leq 3.0$$

where H is a height (mm) of the prism and W is a width (mm) of the prism.

11. The surface treating method of claim 10, wherein the prism is a micro prism satisfying the following formulas:

$$0.5 \leq W \leq 4.0$$

$$0.5 \leq H \leq 4.0.$$

12. An optical element, comprising:
   at least one of a curved surface and an uneven surface on a base material; and a coating layer formed on the at least one of a curved surface and an uneven surface by the surface treating method of claim 1.

13. The optical element of claim 12, wherein the lens is a lens for use in an optical pickup apparatus and the lens satisfies the following formulas:

$$1 \leq D \leq 10$$

$$0.2 \leq T/D \leq 0.5.$$

14. The optical element of claim 12, wherein plural ring-shaped step portions are provided on the effective optical surface and satisfy the following formula:

$$0 < Hi \leq 0.01$$

$$0.001 \leq Li \leq 0.1$$

where Hi is a depth (mm) of the plural ring-shaped step portions and Li is an interval (mm) of the plural ring-shaped step portions.

15. The optical element of claim 12, wherein the base material is a lens array on which plural lens sections are mounted in a form of an array and satisfies the following formulas:

$$0 < Di \leq 300$$

$$0 < Ti/Di \leq 1.0$$

$$0 < Li \leq 200$$

where Di is a diameter (mm) of a lens section, Ti is a thickness (mm) of the lens section and Li is an interval (mm) of the plural lens sections.

16. The optical element of claim 15, wherein the lens array is a micro lens array and satisfies the following formulas:

$$0.01 \leq Di \leq 2$$

$$0.2 \leq Ti/Di \leq 0.5$$

$$0.01 \leq Li \leq 5.$$

17. The optical element of claim 12, wherein at least one of a concave or a convex is provided on the uneven surface of the base material.

18. The optical element of claim 17, wherein plural convexes being shaped in one of a saw tooth and a rectangle are provided on the base material with an arrangement satisfying the following formulas:

$$0 < Li \leq 30$$

$$0 < Hi/Li \leq 3.0$$

$$0 < Wi < Li$$

where Hi is a height (mm) of the convex, Wi is a width (mm) of the convex and Li is an interval (mm) of plural convexes.

19. The optical element of claim 18, wherein some of the plural convexes are provided on the base material with a different interval Lk (mm) and satisfies the following formula:

$$0 < Wi < Lk.$$

20. The optical element of claim 18, wherein the base material is a light introducing plate satisfying the following formulas:

$$0.05 \leq Li \leq 2$$

$$0.01 \leq Hi/Li \leq 0.1.$$

21. The surface treating method of claim 12, wherein the base material is a prism satisfying the following formulas:

$$0 < W \leq 30$$

$$0 < H/W \leq 3.0$$

where H is a height (mm) of the prism and W is a width (mm) of the prism.

22. The surface treating method of claim 21, wherein the prism is a micro prism satisfying the following formulas:

$$0.5 \leq W \leq 4.0$$

$$0.5 \leq H \leq 4.0.$$

* * * * *